United States Patent
Choi

(10) Patent No.: US 12,359,780 B2
(45) Date of Patent: Jul. 15, 2025

(54) LIGHTING MODULE, LIGHTING DEVICE AND LAMP

(71) Applicant: LG INNOTEK CO., LTD., Seoul (KR)

(72) Inventor: Hyun Ho Choi, Seoul (KR)

(73) Assignee: LG INNOTEK CO., Seoul (KR)

( * ) Notice: Subject to any disclaimer, the term of this patent is extended or adjusted under 35 U.S.C. 154(b) by 68 days.

(21) Appl. No.: 18/511,559

(22) Filed: Nov. 16, 2023

(65) Prior Publication Data
US 2024/0084981 A1    Mar. 14, 2024

Related U.S. Application Data

(63) Continuation of application No. 17/622,459, filed as application No. PCT/KR2020/008644 on Jul. 2, 2020, now Pat. No. 11,859,779.

(30) Foreign Application Priority Data

Jul. 3, 2019 (KR) .......................... 10-2019-0080077

(51) Int. Cl.
*F21K 9/68* (2016.01)
*F21S 43/14* (2018.01)
(Continued)

(52) U.S. Cl.
CPC ................ *F21K 9/68* (2016.08); *F21S 43/14* (2018.01); *F21S 43/26* (2018.01); *H10H 20/854* (2025.01);
(Continued)

(58) Field of Classification Search
CPC .............. F21K 9/68; F21S 43/14; F21S 43/26
See application file for complete search history.

(56) References Cited

U.S. PATENT DOCUMENTS 8,109,666 B2    2/2012 Sawada et al.
9,935,764 B2    4/2018 Schulz et al.
(Continued)

FOREIGN PATENT DOCUMENTS

DE    102013212352    12/2014
EP    1895228    3/2008
(Continued)

OTHER PUBLICATIONS

Japanese Office Action dated Jun. 4, 2024 issued in Application No. 2021-578115.
(Continued)

*Primary Examiner* — Christopher E Dunay
(74) *Attorney, Agent, or Firm* — KED & ASSOCIATES, LLP

(57) ABSTRACT

A lighting device disclosed in an embodiment of the invention includes a substrate; a plurality of light emitting devices disposed on the substrate; a resin layer covering the plurality of light emitting devices on the substrate; and a first reflective member disposed on the resin layer, wherein the resin layer includes a first surface facing the plurality of light emitting devices, and a hole disposed between the first surface and the plurality of light emitting devices and the hole penetrates in the direction of the substrate from a lower surface of the first reflective member, and the hole and the light emitting device may overlap in a light emission direction of the light emitting device.

20 Claims, 20 Drawing Sheets

(51) Int. Cl.
　　　*F21S 43/20*　　　(2018.01)
　　　*H10H 20/854*　　(2025.01)
　　　*F21Y 103/10*　　(2016.01)
　　　*F21Y 115/10*　　(2016.01)

(52) U.S. Cl.
　　　CPC ....... *F21Y 2103/10* (2016.08); *F21Y 2115/10* (2016.08)

(56) References Cited

U.S. PATENT DOCUMENTS

| | | | |
|---|---|---|---|
| 10,088,113 B1 | 10/2018 | Chen et al. | |
| 10,203,082 B2 | 2/2019 | Kawabata | |
| 10,295,722 B2 | 5/2019 | Bombard et al. | |
| 10,935,800 B2 | 3/2021 | Kang et al. | |
| 11,164,993 B2 | 11/2021 | Kang et al. | |
| 11,450,786 B2 | 9/2022 | Kang et al. | |
| 11,658,266 B2 | 5/2023 | Kang et al. | |
| 11,747,547 B2* | 9/2023 | Chiu | G02B 6/0073 362/97.1 |
| 11,949,042 B2 | 4/2024 | Kang et al. | |
| 2007/0109810 A1 | 5/2007 | Park et al. | |
| 2008/0062710 A1 | 3/2008 | Stanitzok et al. | |
| 2009/0154196 A1 | 6/2009 | Lin et al. | |
| 2009/0257712 A1* | 10/2009 | Van Gorkom | G02B 6/003 385/31 |
| 2012/0081922 A1 | 4/2012 | Yeh et al. | |
| 2014/0126239 A1 | 5/2014 | Huang et al. | |
| 2015/0003094 A1 | 1/2015 | Gebauer et al. | |
| 2015/0003095 A1 | 1/2015 | Gebauer | |
| 2015/0023056 A1* | 1/2015 | Fang | G02B 6/0015 362/609 |
| 2016/0215950 A1 | 7/2016 | Ender et al. | |
| 2017/0036598 A1* | 2/2017 | Bombard | B60K 35/21 |
| 2017/0276316 A1* | 9/2017 | Kawabata | F21S 43/245 |
| 2018/0313513 A1* | 11/2018 | Park | H10H 20/857 |
| 2019/0179157 A1* | 6/2019 | Kang | G02B 27/0955 |
| 2020/0335660 A1 | 10/2020 | Kang et al. | |
| 2022/0020897 A1 | 1/2022 | Kang et al. | |
| 2022/0393064 A1 | 12/2022 | Kang et al. | |
| 2023/0317875 A1 | 10/2023 | Kang et al. | |
| 2024/0194824 A1 | 6/2024 | Kang et al. | |

FOREIGN PATENT DOCUMENTS

| | | |
|---|---|---|
| FR | 3044744 | 6/2017 |
| JP | 2001-166151 | 6/2001 |
| JP | 2005-071798 | 3/2005 |
| JP | 2008-140550 | 6/2008 |
| JP | 2015-167124 | 9/2015 |
| JP | 2016-540359 | 12/2016 |
| JP | 2017-174657 | 9/2017 |
| JP | 2019-105827 | 6/2019 |
| JP | 2021-503155 | 2/2021 |
| KR | 10-0513718 | 9/2005 |
| KR | 10-2008-0066876 | 7/2008 |
| KR | 10-2014-0072635 | 6/2014 |
| KR | 10-2019-0054605 | 5/2019 |
| WO | WO 2015086925 | 6/2015 |

OTHER PUBLICATIONS

International Search Report dated Oct. 13, 2020 issued in Application No. PCT/KR2020/008644.

Extended European Search Report dated Jun. 30, 2023 issued in Application No. 20834121.4.

U.S. Office Action dated Apr. 18, 2023 issued in U.S. Appl. No. 17/622,459.

* cited by examiner

LIGHTING MODULE, LIGHTING DEVICE AND LAMP

CROSS-REFERENCE TO RELATED PATENT APPLICATIONS

This application is a continuation of U.S. application Ser. No. 17/622,459, filed on Dec. 23, 2021, which is a U.S. National Stage Application under 35 U.S.C. § 371 of PCT Application No. PCT/KR2020/008644, filed Jul. 2, 2020, which claims priority to Korean Patent Application No. 10-2019-0080077, filed Jul. 3, 2019, whose entire disclosures are hereby incorporated by reference.

TECHNICAL FIELD

An embodiment of the invention relates to a lighting module having a plurality of light emitting devices. An embodiment of the invention relates to a lighting module providing a line-shaped surface light source, a lighting device having the same, a light unit, a liquid crystal display device, and a vehicle lamp.

BACKGROUND ART

Lighting applications include vehicle lights as well as backlights for displays and signage. Light emitting diodes (LEDs) have advantages such as low power consumption, semi-permanent lifespan, fast response speed, safety, and environmental friendliness compared to conventional light sources such as fluorescent lamps and incandescent lamps. Such a light emitting device is applied to various lighting devices such as various display devices, indoor lights or outdoor lights. Recently, as a light source for a vehicle, a lamp employing an LED has been proposed. Compared with incandescent lamps, LEDs are advantageous in that their power consumption is small. However, since an emission angle of the light emitted from the LED is small, when the LED is used as a vehicle lamp, there is a demand for increasing the light emitting area of the lamp using the LED. Because LED is small in size, it can increase the design freedom of the lamp, and it is also economical due to its semi-permanent lifespan.

DISCLOSURE

Technical Problem

An embodiment of the invention provides a lighting module or a lighting device for emitting light emitted from a plurality of light emitting devices in the form of a line. An embodiment of the invention provides a lighting module or lighting device having an exit surface having a line width in one direction of a plurality of light emitting devices. An embodiment of the invention provides a lighting module or lighting device having a transparent exit surface having a line width around a plurality of light emitting devices. An embodiment of the invention provides a lighting module or lighting device in which a resin layer having one or a plurality of holes is disposed along a plurality of light emitting devices. An embodiment of the invention provides a lighting module or lighting device having a resin layer in which holes arranged in one or two rows along a plurality of light emitting devices are arranged. An embodiment of the invention provides a lighting module or lighting device in which a reflective member is disposed on an upper surface and a lower surface of a resin layer on which a plurality of light emitting devices are disposed. Embodiments of the invention may provide a lighting module for irradiating side light or surface light in the form of a line, and a lighting device having the same, a light unit, a liquid crystal display device, and a vehicle lamp.

Technical Solution

A lighting device according to an embodiment of the invention includes: a substrate; a plurality of light emitting devices disposed on the substrate; a resin layer disposed on the substrate; and a first reflective member disposed on the resin layer, wherein the resin layer includes a first surface facing emission surfaces of the plurality of light emitting devices, and a hole disposed between the first surface and the plurality of light emitting devices, wherein the hole passes through the resin layer in a direction of the substrate from a lower surface of the first reflective member, and the hole and the light emitting device may overlap in the light emission direction of the light emitting device. According to an embodiment of the invention, the hole may include a plurality of holes facing each of the plurality of light emitting devices and spaced apart from each other. Each of the plurality of holes may face the emission surface of the plurality of light emitting devices, and may have an area greater than an area of the emission surface. The hole may have a length longer than a length connecting both ends of the plurality of light emitting devices.

According to an embodiment of the invention, the hole may be disposed closer to the light emitting device than to the first surface of the resin layer. The holes may be arranged in two rows between the light emitting device and the first surface of the resin layer, and at least one of the holes in the two rows may be arranged in plurality. An embodiment of the invention may include a second reflective member between the substrate and the resin layer, and the hole may be disposed between the first reflective member and the second reflective member. A height of the hole may be in a range of 50% to 100% of a thickness of the resin layer. The hole includes a first surface portion facing the emission surface of the light emitting device, and a second surface portion and a third surface portion in which a distance from both ends of the first surface portion toward the first surface of the resin layer is gradually narrowed, wherein an inner angle formed by the second surface portion and the third surface portion may be in a range of 60 degrees to 120 degrees. According to an embodiment of the invention, a virtual line connecting the plurality of light emitting devices may include a straight line, an oblique line, or a curved line, and the virtual line connecting the plurality of holes may be a straight line, an oblique line or a curved line. The hole may include a bar shape parallel to the first surface.

Advantageous Effects

According to an embodiment of the invention, the luminous intensity of the light source may be improved and may be provided as a line-shaped surface light source by a plurality of point light sources. In addition, it is possible to reduce the manufacturing process of the lighting module. According to an embodiment of the invention, it is possible to improve light efficiency by reducing light loss. In addition, since the lighting module of the thin thickness is provided in the form of a line light, the freedom degree in design can be increased and the light uniformity of the surface light can be improved. It is possible to improve the optical reliability of the lighting module and the lighting device having the same according to an embodiment of the invention. In addition, it is possible to improve the reliability of the vehicle lighting device having the lighting module. In addition, it may be applied to a light unit having a lighting module, various types of display devices, lighting devices, or vehicle lamps.

BEST MODE

Figure 1:
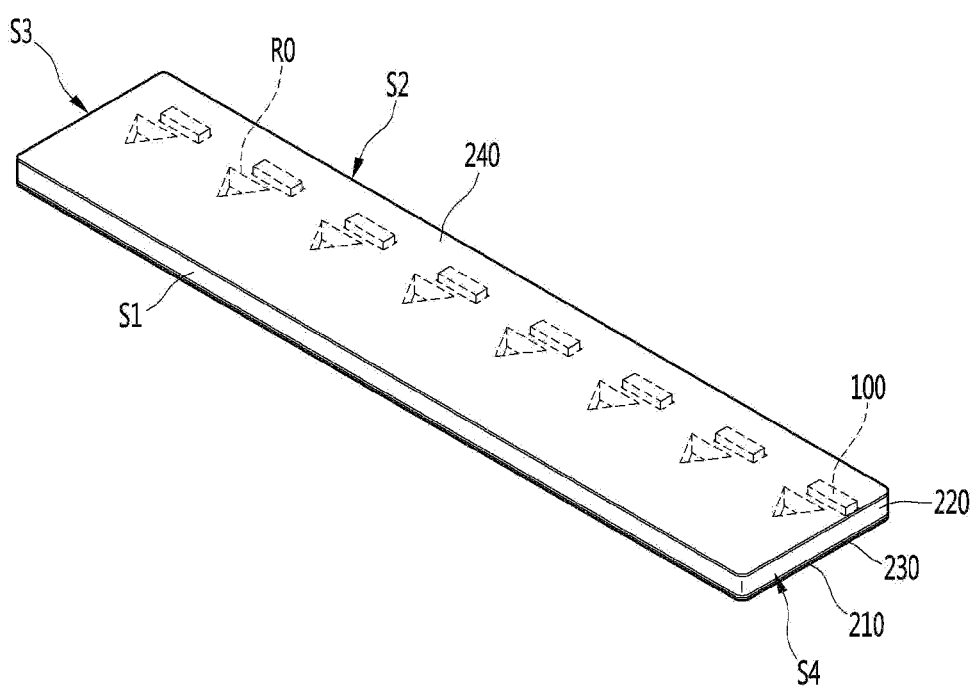
FIG. 1 is a perspective view showing a lighting module according to a first embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The lighting device according to the invention may be applied to various lamp devices that require lighting, such as vehicle lamps, household lighting devices, and industrial lighting devices. For example, when applied to vehicle lamps, it is applicable to head lamps, car width lights, side mirror lights, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development. Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Module>

Figure 21:
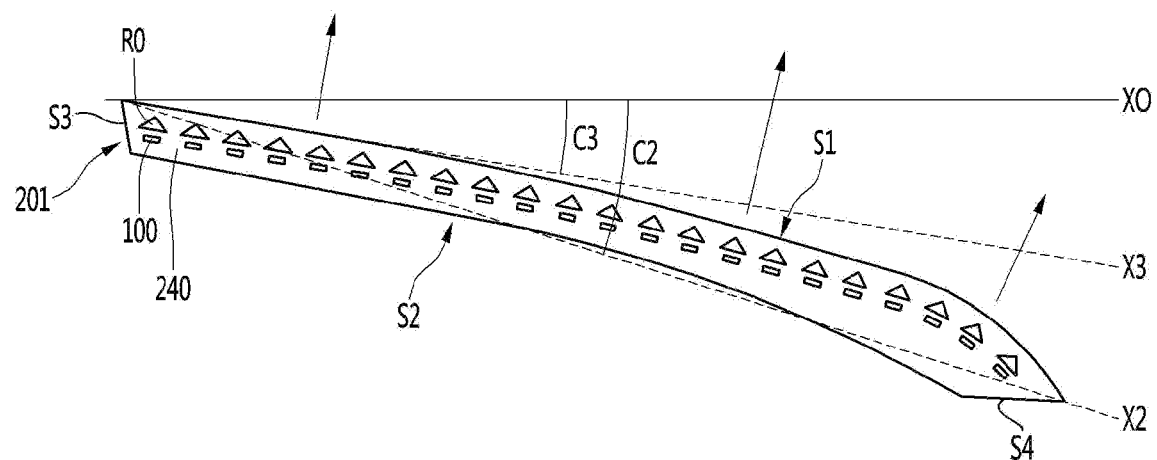
FIG. 21 is a modified example of the lighting module according to the first or second embodiment of the invention.

As shown in FIGS. 1 to 7, a lighting module 200 according to an embodiment of the invention is a device that includes a plurality of light emitting devices 100 and emits light emitted from the light emitting devices 100 as line-shaped surface light. The lighting module 200 may have a side, an exit surface, or a transparent surface having a line width around the plurality of light emitting devices 100. The lighting module 200 may be provided with an exit surface having a predetermined width or a transparent surface on one surface of the plurality of light emitting devices 100. The lighting module 200 may include a first surface S1 facing one surface of the light emitting device 100, a second surface S2 opposite to the first surface S1, and third and fourth surfaces S3 and S4 extending in a second direction from both ends of the first surface S1 and the second surface S2. The first and second surfaces S1 and S2 may face each other. At least a portion of the third and fourth surfaces S3 and S4 may face each other. As another example, as shown in FIG. 21, the third and fourth surfaces S3 and S4 may not face each other. The minimum distance between the first and second surfaces S1 and S2 may be smaller than the minimum distance between the third and fourth surfaces S3 and S4.

The first surface S1 and the second surface S2 may have a long length in one direction or the first direction X. The one direction or the first direction X may be a straight line or may include a curve as shown in FIG. 21. The third surface S3 and the fourth surface S4 may be perpendicular to the first direction X, or may be perpendicular to the first or second surfaces S1 and S2. The first surface S1 may face the emission surface 111 of the light emitting device 100 or may be a surface exposed in the second direction from the first ends of the third surface S3 and the fourth surface S4. The second surface S2 may be a surface that faces the non-emission surface of the plurality of light emitting devices 100 or is exposed in the second direction from the second ends of the third surface S3 and the fourth surface S4. The third and fourth surfaces S3 and S4 may be different from the first and second surfaces S1 and S2.

In the lighting module 200, a plurality of light emitting devices 100 may be arranged in a first direction or along a region between the first surface S1 and the second surface S2. The plurality of light emitting devices 100 may be arranged in one row. The virtual line connecting the light emitting devices 100 arranged in one row may be a straight line or may include a curved line having a curvature. As another example, the plurality of light emitting devices may be arranged in two rows, and the light emitting devices in the second row are disposed between the first surface S1 and the second surface S2 in a column direction (e.g., a Y direction). They may be disposed so as not to overlap each other. The plurality of light emitting devices 100 arranged in the first direction X may face the first surface S1 or the exit surface, respectively. Each of the emission surfaces 111 of the plurality of light emitting devices 100 may face the first surface S1. The light emitted from the light emitting device 100 may be emitted through the first surface S1, and some light passes may be emitted through at least one of the second surface S2, the third surface S3, and the fourth surface S4.

Figure 2:
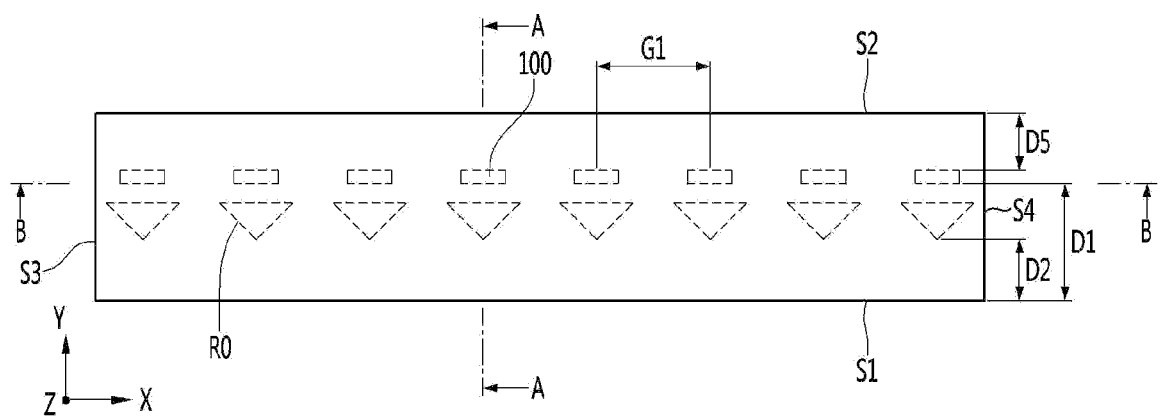
FIG. 2 is a plan view of the lighting module of FIG. 1.

As shown in FIGS. 2 to 5, the lighting module 200 may have a length X1 in the first direction X longer than a width Y1 in the second direction Y. The length X1 in the first direction may vary depending on the number of arrangements of the light emitting devices 100, and may be, for example, 30 mm or more. The width Y1 in the second direction may be 13 mm or more or 16 mm or more. The width Y1 in the second direction Y of the lighting module 200 may provide a region in which the emitted light of the light emitting device 100 is diffused and a region protecting the rear of the light emitting device 100. As shown in FIG. 2, a distance D1 between the light emitting device 100 and the first surface S1 and a distance D5 between the light emitting device 100 and the second surface S2 based on the light emitting device 100 may be different from each other. The distance D5 between the light emitting device 100 and the second surface S2 may be 2 mm or more, for example, may be in the range of 2 mm to 20 mm. When the distance D5 between the light emitting device 100 and the second surface S2 is smaller than the above range, the region where moisture may penetrate or form a circuit pattern may be reduced, and when larger than the above range, a size of the lighting module 200 may be increased. In the lighting module 200, the first surface S1, the second surface S2, the third surface S3, and the fourth surface S4 may be provided as surfaces perpendicular to the third direction Z. The third direction Z may be a direction orthogonal to the first and second directions X and Y. The first surface S1, the second surface S2, the third surface S3, and the fourth surface S4 may have the same thickness or the same height in the third direction Z. The lighting module 200 includes a substrate 210, a resin layer 220 on the substrate 210, and a first reflective member 240 on the resin layer 220. The first to fourth surfaces S1, S2, S3, and S4 may be side surfaces of the resin layer 220. The resin layer 220 includes the first surface S1, the second surface S2, the third surface S3, and the fourth surface S4. The resin layer 220 may be disposed to surround the device disposed on the substrate 210, for example, one or a plurality of light emitting devices 100. At least three or more of the plurality of light emitting devices 100 may be arranged in the first direction, and may be disposed in the resin layer 220. The plurality of light emitting devices 100 may be disposed between the substrate 210 and the first reflective member 240. The resin layer 220 may be made of a light-transmitting material such as silicone or epoxy. The resin layer 220 may include a glass material as another material.

The lighting module 200 may include a second reflective member 230 between the resin layer 220 and the substrate 210. The second reflective member 230 may not be formed, and a reflective member may be attached to the upper surface of the substrate 210 to serve as the second reflective member 230. The substrate 210 includes a printed circuit board (PCB), for example, a resin-based printed circuit board (PCB), a metal core PCB, a flexible PCB, and a ceramic PCB, or a FR-4 substrate. The substrate 210 may be a flexible or non-flexible substrate. A circuit pattern may be disposed on the substrate 210. The circuit pattern of the substrate 210 may include a plurality of pads in a region corresponding to the light emitting device 100. Among the regions of the substrate 210, a rear region with respect to the light emitting device 100 is a region opposite to a region from which light is emitted, and circuit patterns for connecting the light emitting devices 100 may be disposed. The width of the rear region may vary according to the number of the light emitting devices 100 or a connection method of the light emitting devices 100. The width of the rear region is the distance D5 between the light emitting device 100 and the second surface S2, and may be 2 mm or more. Accordingly, a circuit pattern for connecting the plurality of light emitting devices 100 and suppressing moisture penetration from the rear of the light emitting device 100 may be formed.

Figure 3:
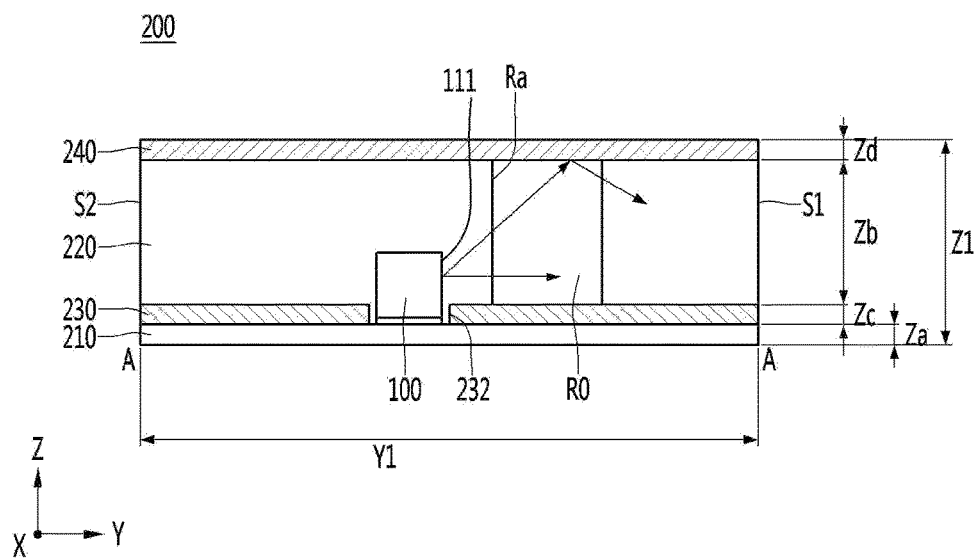
FIG. 3 is a cross-sectional view taken along the A-A side of the lighting module of FIG. 2.
Figure 4:
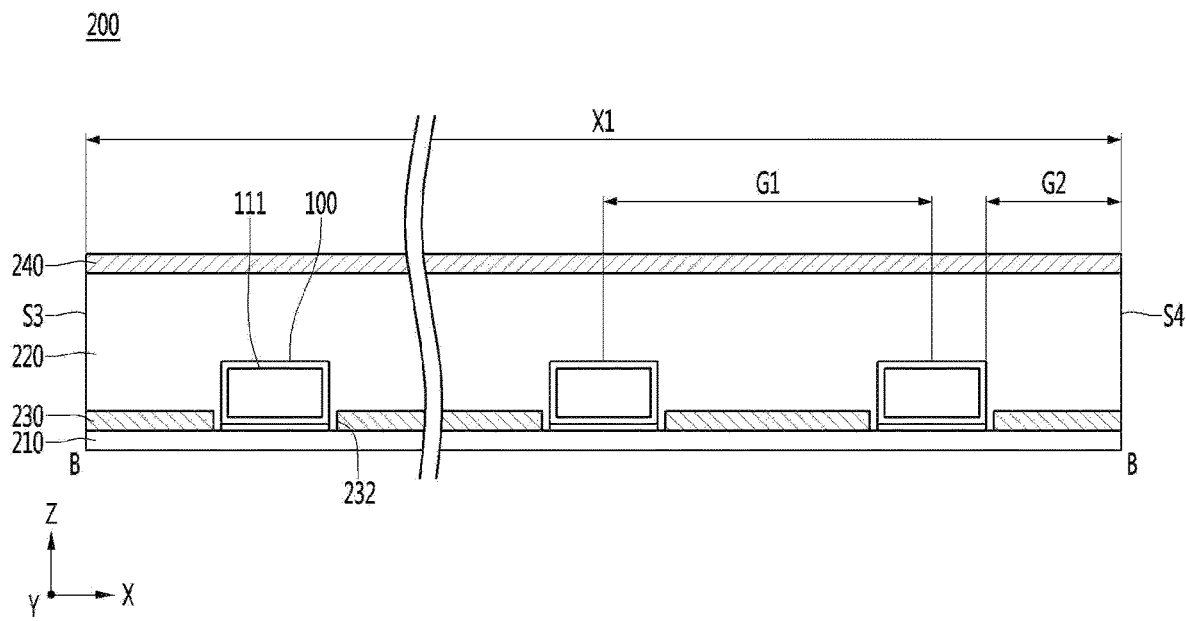
FIG. 4 is a cross-sectional view taken along the B-B side of the lighting module of FIG. 2.
Figure 5:
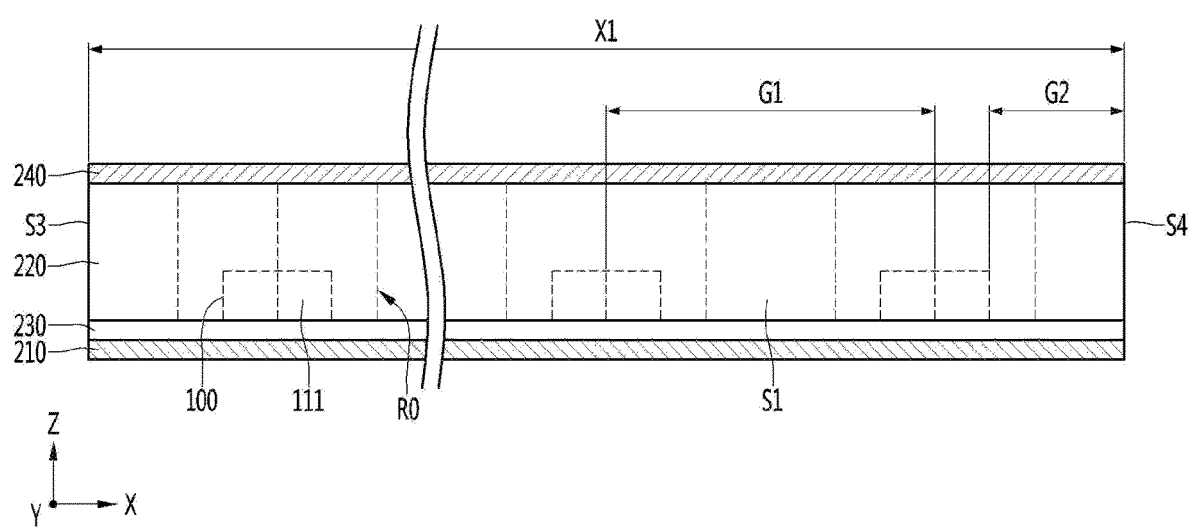
FIG. 5 is a front view of the lighting module of FIG. 2.
Figure 6:
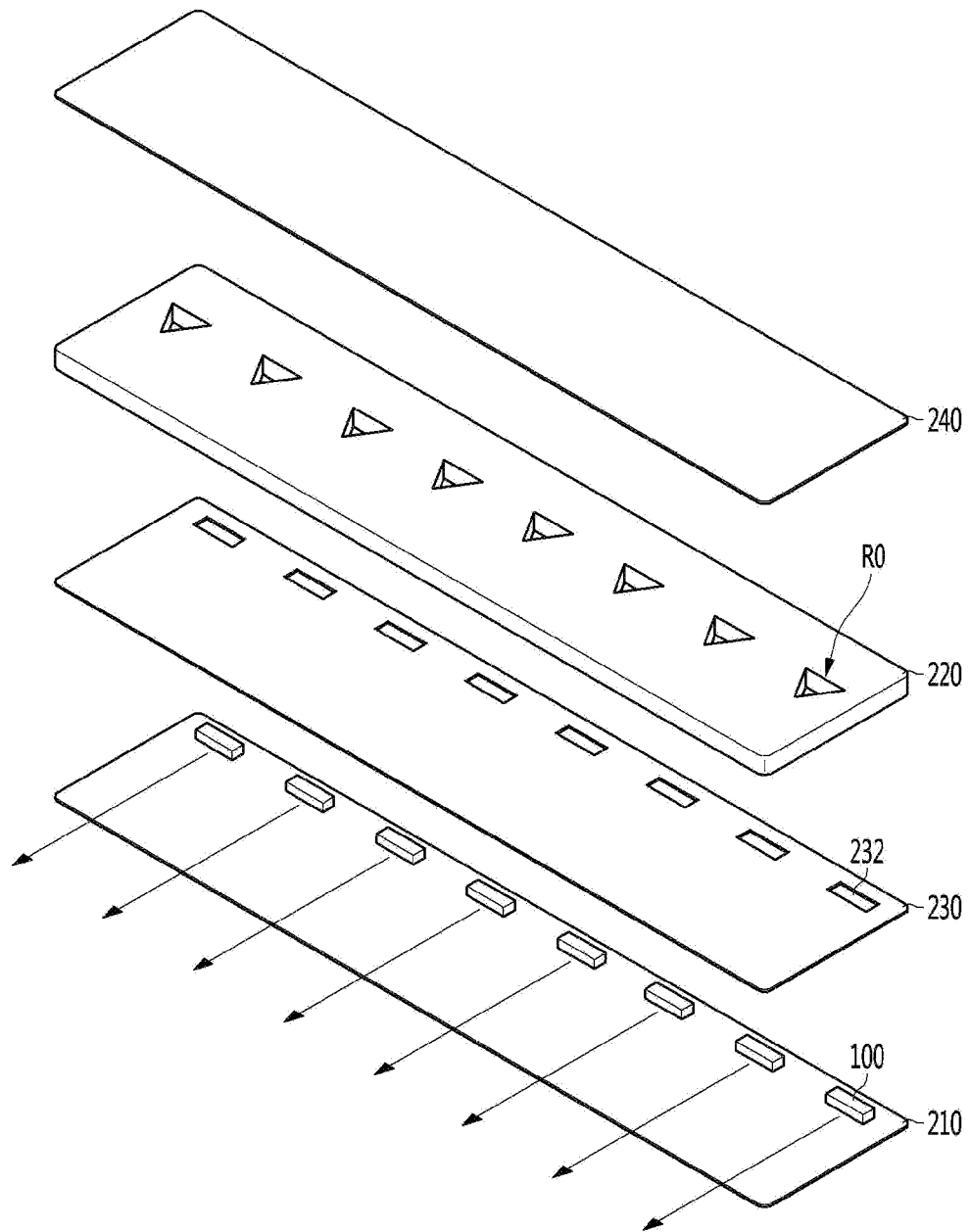
FIG. 6 is an exploded perspective view of the lighting module of FIG. 2.

The plurality of light emitting devices 100 may have a bonding portion disposed thereunder and may be electrically connected to the pad of the substrate 210. The plurality of light emitting devices 100 may be connected in series by a circuit pattern of the substrate 210. As another example, the plurality of light emitting devices 100 may be connected in parallel by a circuit pattern of the substrate 210, or two or more groups connected in series may be connected in parallel. The light emitting device 100 may include a device including a light emitting chip or a package in which an LED chip is packaged. The light emitting chip may emit at least one of blue, red, green, and ultraviolet (UV) light. The light emitting device 100 may emit at least one of white, blue, red, and green. The light emitting device 100 may emit light in a lateral direction, and a bottom portion may be disposed on the substrate 210. The light emitting device 100 may be a side view type. As another example, the light emitting device 100 may be an LED chip, and one surface of the LED chip may be opened and a reflective member may be disposed on the other surface. The emission surface 111 of the light emitting device 100 may be disposed on a surface adjacent to the substrate 210, for example, on a side adjacent to the upper surface of the substrate 210. The emission surface 111 is disposed on a side surface between the bottom and the upper surfaces of the light emitting device 100, and emits light in the second direction Y. The emission surface 111 of the light emitting device 100 may be adjacent to the second reflective member 230 and may be a surface perpendicular to the upper surface of the substrate 210 and the upper surface of the second reflective member 230. The thickness of the light emitting device 100 may be smaller than the length of the light emitting device 100 in the first direction X. The thickness of the light emitting device 100 may be 3 mm or less, for example, 2 mm or less. The thickness of the light emitting device 100 may be in the range of 1 mm to 2 mm, for example, in the range of 1.2 mm to 1.8 mm. 4 and 5, the pitch G1 between the light emitting devices 100 may be 10 mm or more, for example, 10 mm to 30 mm. In addition, the distance G2 between the outermost light emitting device 100 and the third or fourth sides S3 and S4 of the resin layer 220 may be smaller than the pitch G1, and may be 10 mm or less. The length of the light emitting device 100 in the first direction X (L1 in FIG. 7) may be greater than the thickness of the light emitting device 100, for example, 1.5 times or more of the thickness of the light emitting device 100. Since the light emitting device 100 has a thin thickness and a long length in the first direction X, the light emission angle in the first direction X which is a left-right direction with respect to the center of the light emitting device 100 may be provided widely. Here, the light emission angle in the first direction X of the light emitting device 100 may be greater than the light emission angle in the third direction Z, which is an up-down direction. The light emission angle of the light emitting device 100 in the second direction Y may be in the range of 110 degrees to 160 degrees. Here, as shown in FIG. 3, the thickness Za of the substrate 210 may be smaller than the thickness of the light emitting device 100. The thickness of the light emitting device 100 may be more than twice the thickness Za of the substrate 210, for example, may be in the range of 2 times to 4 times. Since the thickness Za of the substrate 210 is thin, the lighting module 200 may be provided as a flexible plate.

The resin layer 220 may be disposed on the substrate 210. The second reflective member 230 may be disposed between the resin layer 220 and the substrate 210. The resin layer 220 may cover the light emitting device 100, and the first reflective member 240 may cover an upper surface of the resin layer 220. The resin layer 220 may be in contact with the upper surface and side surfaces of the light emitting device 100. The resin layer 220 may be in contact with the upper surface of the second reflective member 230. A portion of the resin layer 220 may be in contact with the substrate 210 through the opening 232 of the second reflective member 230. The resin layer 220 may be in contact with the emission surface of the light emitting device 100. The first surface S1, the second surface S2, the third surface S3, and the fourth surface S4 of the resin layer 220 are side surfaces between the first and second reflective members 240 and 230. The first surface S1, the second surface S2, the third surface S3, and the fourth surface S4 may be peripheral surfaces of the light emitting device 100 or surfaces corresponding to the side surfaces of the light emitting device 100. The upper surface area of the resin layer 220 may be the same as the upper surface area of the substrate 210, the upper surface area of the second reflective member 230, or the upper surface area of the first reflective member 240. The length of the resin layer 220 in the first direction may be the same as the length of the substrate 210, the length of the second reflective member 230, or the length of the first reflective member 240. The maximum width Y1 of the resin layer 220 in the second direction may be the same as the maximum width of the substrate 210, the maximum width of the second reflective member 230 or the maximum width of the first reflective member 240. The resin layer 220 may be disposed between the first and second reflective members 240 and 230. The upper surface of the second reflective member 230 and the lower surface of the first reflective member 240 may be disposed to face each other on the lower surface and the upper surface of the resin layer 220. The upper surface of the first reflective member 230 and the lower surface of the second reflective member 230 may have the same area. Accordingly, the resin layer 220 may diffuse the light emitted from the light emitting device 100 and the light reflected by the first and second reflective members 240 and 230 to guide them in the lateral direction. The resin layer 220 may be formed to a thickness Zb that is thicker than that of the light emitting device 100. Accordingly, the resin layer 220 may protect the upper portion of the light emitting device 100 and prevent moisture penetration. Since the substrate 210 is disposed on the lower portion of the light emitting device 100 and the resin layer 220 is disposed on the upper portion of the light emitting device 100, the light emitting device 100 may be protected. Accordingly, the interval between the upper surface of the resin layer 220 and the light emitting device 100 may be 0.6 mm or less, for example, in the range of 0.5 mm to 0.6 mm. An upper portion of the resin layer 220 may be disposed to have the same thickness as the gap to protect an upper portion of the light emitting device 100. The thickness Zb of the resin layer 220 is the distance between the first and second reflective members 240 and 230, and the distance (e.g., Zb) between the first and second reflective members 240 and 230 may be smaller than a distance between the first surface S1 and the second surface S2. For example, the distance between the first surface S1 and the second surface S2 may include a maximum distance or a minimum distance. The distance or interval between the second reflective member 230 and the first reflective member 240 may be smaller than the distance or interval between the first surface S1 and the second surface S2 of the resin layer 220. By disposing the distance between the first and second reflective members 240 and 230 to be smaller than the width Y1 or the minimum width in the second direction of the lighting module 200, a surface light in the form of a line is provided and the luminous intensity is improved and a hot spot may be prevented. In addition, it is possible to provide a lighting module flexible in the third direction. The thickness Zb of the resin layer 220 may be less than or equal to twice the thickness of the light emitting device 100, for example, more than 1 to 2 times or less. The thickness Zb of the resin layer 220 may be, for example, in the range of 1.5 mm to 1.9 mm or in the range of 1.6 mm to 1.8 mm. The thickness Zb of the resin layer 220 may be 0.8 times or less of the thickness Z1 of the lighting module 200, for example, in a range of 0.4 times to 0.8 times the thickness Z1 of the lighting module 200. Since the resin layer 220 is disposed with a difference of 1.2 mm or less from the thickness Z1 of the lighting module 200, it is possible to prevent a decrease in light efficiency in the lighting module 200 and to strengthen the ductility characteristics. The resin layer 220 may include a resin material such as silicone, silicone molding compound (SMC), epoxy, or epoxy molding compound (EMC). The resin layer 220 may include a UV (ultra violet) curable resin or a thermosetting resin material, for example, may selectively include PC, OPS, PMMA, PVC, and the like. The resin layer 220 may include a phosphor. The phosphor may include at least one of a yellow phosphor, a green phosphor, a blue phosphor, and a red phosphor. A light extraction structure such as a concave-convex structure may be disposed on the first surface S1 of the resin layer 220, but the invention is not limited thereto. On the first surface S1, a first region horizontally overlapping with the light emitting device 100 and a second region horizontally overlapping with a region between the light emitting devices may be disposed on the same plane. As another example, the second region may be concave in a second surface direction than the first region, or the first region may protrude more convex than the second region.

The second reflective member 230 may reflect the light emitted from the light emitting device 100. The second reflective member 230 may be formed on the upper surface of the substrate 210. The second reflective member 230 may be formed as an upper layer of the substrate 210 or as a separate layer. The second reflective member 230 may be adhered to the upper surface of the substrate 210 with an adhesive. The resin layer 220 may be adhered to the upper surface of the second reflective member 230. The second reflective member 230 has a plurality of openings 232 in a region corresponding to the lower surface of the light emitting device 100, and the light emitting device 100 may be connected to the substrate 210 through the openings 232. A portion of the resin layer 220 may be in contact with the substrate 210 through the opening 232. The opening 232 may be a region in which the light emitting device 100 may be bonded to the substrate 210. The second reflective member 230 may be formed in a single-layer or multi-layer structure. The second reflective member 230 may include a material that reflects light, for example, a metal or a non-metal material. When the second reflective member 230 is a metal, it may include a metal layer such as stainless steel, aluminum (Al), or silver (Ag), and in the case of a non-metallic material, it may include a white resin material or a plastic material. The second reflective member 230 may include a white resin material or a polyester (PET) material. The second reflective member 230 may include at least one of a low reflection film, a high reflection film, a diffuse reflection film, and a regular reflection film. The second reflective member 230 may be provided as, for example, a regular reflection film for reflecting the incident light to the first surface S1.

One end of the second reflective member 230 may be disposed on the same plane as the first surface S1. The other end of the second reflective member 230 may be disposed on the same plane as the second surface S2. As another example, one end and the other end of the second reflective member 230 may be spaced apart from the first surface S1 and the second surface S2 and may be in contact with the resin layer 220. That is, the outside of the second reflective member 230 may be covered with the resin layer 220 to prevent moisture from penetrating. The thickness Zc of the second reflective member 230 may be smaller than the thickness Za of the substrate 210. The thickness Zc of the second reflective member 230 may be 0.5 times or more of the thickness Za of the substrate 210 to reduce transmission loss of incident light. The thickness Zc of the second reflective member 230 may be in the range of 0.2 mm to 0.4 mm, and when it is smaller than the above range, light transmission loss may occur, and when it is thicker than the above range, the thickness Z1 of the lighting module 200 may increase.

The first reflective member 240 may be disposed on the resin layer 220. The first reflective member 240 may be adhered to the upper surface of the resin layer 220. The first reflective member 240 may be disposed on the entire upper surface of the resin layer 220 to reduce light loss. The first reflective member 240 may be made of the same material as the second reflective member 230. In order to reflect light and reduce transmission loss of light, the first reflective member 240 may be made of a material having a higher light reflectance than that of the second reflective member 230 or may have a thicker thickness. The first reflective member 240 may have the same thickness or a thicker thickness as the second reflective member 230. For example, the first and second reflective members 240 and 230 may be provided with the same material and the same thickness. The first reflective member 230 may be spaced apart from the edge of the substrate 210, and a portion of the resin layer 220 may be in contact with an edge-side upper surface of the substrate 210. When the resin layer 220 is in contact with the edge of the substrate 210, moisture penetration may be suppressed. The thickness Zd of the first reflective member 240 may be smaller than the thickness Za of the substrate 210. The thickness Zd of the first reflective member 240 is disposed to be 0.5 times or more of the thickness Za of the substrate 210, thereby reducing transmission loss of incident light. The thickness Zd of the first reflective member 240 may be in the range of 0.2 mm to 0.4 mm, and when it is smaller than the range, light transmission loss may occur, and when it is thicker than the above range, the thickness Z1 of the lighting module 200 may increase. The first reflective member 240 may be formed in a single-layer or multi-layer structure. The first reflective member 240 may include a material that reflects light, for example, a metal or a non-metal material. When the first reflective member 240 is a metal, it may include a metal layer such as stainless steel, aluminum (Al), or silver (Ag), and in the case of a non-metallic material, it may include a white resin material or a plastic material. The first reflective member 240 may include a white resin material or a polyester (PET) material. The first reflective member 240 may include at least one of a low reflection film, a high reflection film, a diffuse reflection film, and a regular reflection film. The first reflective member 240 may be provided as a regular reflective film so that, for example, incident light travels in the direction of the first surface S1.

The exit surface of the resin layer 220 may be treated as a haze surface, so that light may be diffused. The haze surface may be treated as a surface rougher than the inner surface of the resin layer 220 to diffuse the emitted light.

The lighting module 200 according to an embodiment of the invention may provide the thickness Z1 in the third direction in the form of a line to provide a surface light source in the form of a line having ductility. The thickness Z1 of the lighting module 200 may be 3 mm or less. That is, the lighting module 200 may be provided as a line-shaped surface light source of 3 mm or less. As another example, the lighting module 200 may be larger than 3 mm and may be arranged to be 6 mm or less. In this case, the thickness of the lighting module 200 is increased, but the thickness of the resin layer 220 is increased to increase the line width and to increase the light distribution region. Referring to FIG. 3, looking at the thickness of each component in the lighting module 200, the thickness of the substrate 210 is Za, the thickness of the resin layer 220 is Zb, and the thickness of the second reflective member 230 is Zc, and the thickness of the first reflective member 240 is Zd, there may have a relationship of $Zb>Za>Zd \geq Zc$. An interval between the lower surface of the substrate 210 and the upper surface of the first reflective member 240 is the thickness Z1 of the lighting module 200. The thickness Zb may be a ratio of 0.4 to 0.8 of Z1, the thickness Za may have a ratio of 0.14 to 0.18 of Z1, and the thickness Zd or Zc may have a ratio of 0.08 to 0.12 of Z1. The Zb may have a ratio of 3.5 to 4 of Za. The Zb may have a ratio of 5.8 to 6.4 of Zc or Zd. By disposing the thickness Zb of the resin layer 220 thicker than the thickness Za of the substrate 210, the light emitting device 100 may be protected and light is diffused to guide it, and the ductility may be strengthened. In addition, since a line-shaped exit surface having a thickness Zb or a height of the resin layer 220 is provided, a line exit surface may be provided.

Figure 7:
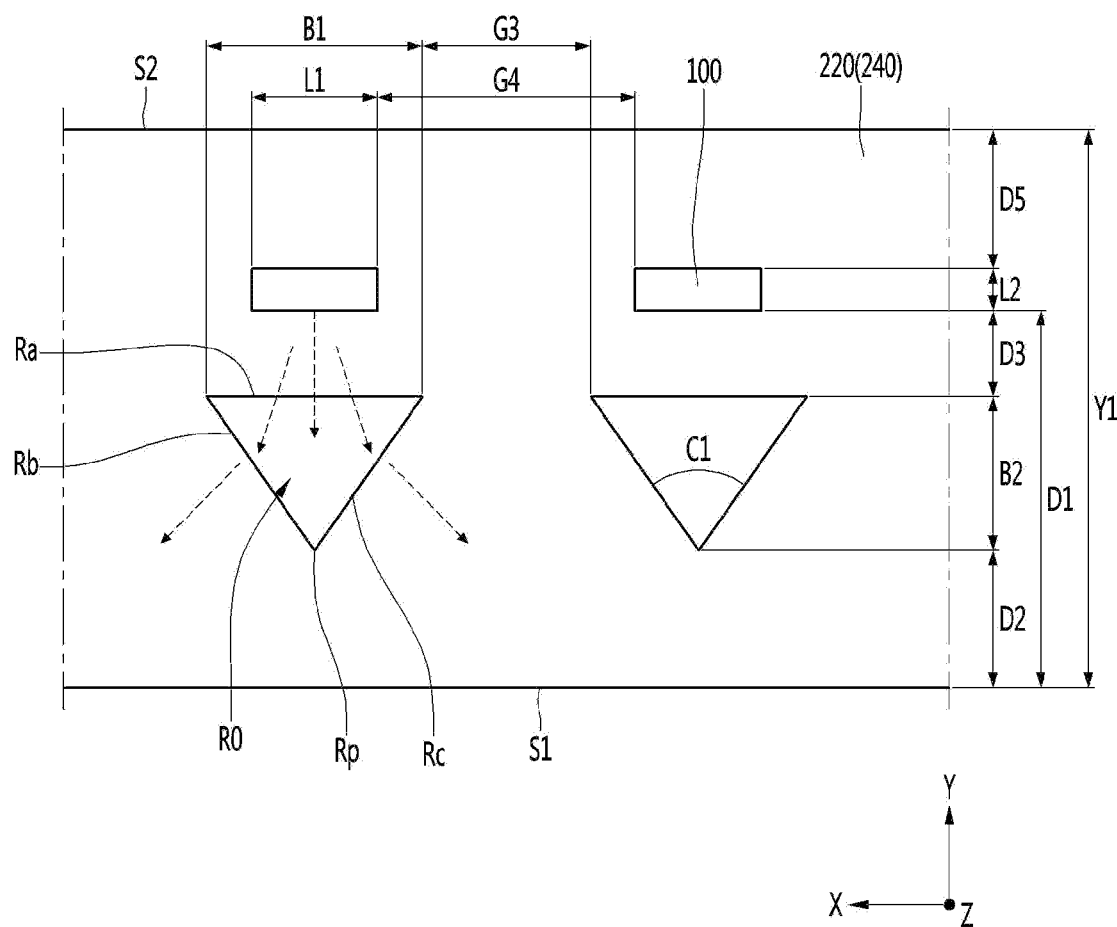
FIG. 7 is a partially enlarged view of the lighting module of FIG. 2.

Referring to FIGS. 2 and 7, in the first embodiment of the invention, the resin layer 220 includes a hole R0 therein. The hole R0 may penetrate the resin layer 220 from the upper surface of the resin layer 220 toward the substrate 210 or may be recessed through the resin layer 220. One or a plurality of the holes R0 may be disposed. The hole R0 may be disposed between each of the light emitting devices 100 and the first surface S1. At least a portion of the hole R0 may horizontally overlap the emission surface 111 of the light emitting device 100. The hole R0 may diffuse the light emitted from the light emitting device 100. A material filling the hole R0 may be different from the refractive index of the resin layer 220. The material filling the hole R0 may have a refractive index lower than that of the material of the resin layer 220. A gas may be disposed in the hole R0, and may include, for example, air or at least one of oxygen, nitrogen, hydrogen, argon, and carbon dioxide gas. The hole R0 may be in a vacuum state. As another example, the hole R0 may be filled with a material having a higher refractive index than that of the resin layer 220. The material having a high refractive index may include a metal oxide or a metal nitride. The hole R0 and each light emitting device 100 may overlap in a direction from the first surface S1 toward the light emitting device 100. An area of each of the holes R0 may be greater than an area of each emission surface of the light emitting device 100. That is, a hole R0 having a larger area than the front area of each light emitting device 100 may be provided in front of each light emitting device 100. A maximum length B1 of the hole R0 in the first direction X may be greater than a length L1 of each light emitting device 100 in the first direction. The maximum length B1 of the hole R0 in the first direction may be greater than the length of the emission surface 111 of each light emitting device 100 in the first direction. Accordingly, the hole R0 may cover the emission-side region of the light emitting device 100 in the first direction, and may diffuse incident light having a predetermined orientation angle distribution. The length B1 may be 1 mm or more greater than the length L1 of the light emitting device 100 or 115% or more compared to the length L1. The maximum width B2 of the hole R0 in the second direction may be equal to or greater than the width L2 of the light emitting device 100. The maximum width B2 in the second direction of the hole R0 may be 1 mm or more, for example, 1 mm to 4 mm. When the maximum width B2 in the second direction of the hole R0 is smaller than the above range, processing is difficult and when larger than the above range, the improvement rate of light uniformity may be insignificant. The hole R0 may be disposed in a region of 5% or more, for example, 5% to 60% of the distance D1 between the light emitting device 100 and the first surface S1.

The minimum distance D2 between the first surface S1 of the resin layer 220 and the hole R0 may be smaller than the minimum distance D1 between the light emitting device 100 and the first surface S1 of the resin layer 220. The minimum distance D2 between the first surface S1 of the resin layer 220 and the hole R0 may be equal to or greater than the minimum distance D3 between the hole R0 and the light emitting device 100. That is, the hole R0 may be disposed closer to the light emitting device 100 than the first surface S1 of the resin layer 220. The minimum distance D1 between the light emitting device 100 and the first surface S1 of the resin layer 220 may be 4 mm or more, for example, 4 mm to 10 mm, or 4 mm to 20 mm. As the minimum distance D2 is arranged in a range of 10% to 60% of the distance D1, the incident lights may be refracted by the hole R0 and then diffused. The minimum distance D3 between the hole R0 and the light emitting device 100 may be 2 mm or more, for example, 2 mm to 4 mm. When the minimum distance D3 is smaller than the above range, the distribution of the beam angle of the light emitting device 100 may be affected, and light extraction efficiency may be reduced. The minimum distance D3 may be a minimum distance in consideration of an error between a mounting process of the light emitting device 100 and a fixing pin (see, 291 of FIG. 23) inserted when the hole R0 is formed. The distance G4 between the light emitting devices 100 may be 5 mm or more, for example, between 5 mm and 18 mm. When the distance G4 is too narrow, the number of light emitting devices 100 may be increased, and when the distance G4 is too large, dark portions may be generated between the light emitting devices 100. The distance G4 may vary according to the distribution of the orientation angle of the light emitting device 100. The hole R0 may be disposed on a one-to-one basis with the light emitting device 100, thereby reducing a hot spot on a central region of the light emitting device 100. When a plurality of holes R0 are disposed, the distance G3 between the holes R0 may be smaller than the distance G4 between the light emitting devices 100. The distance G3 may be 100% or more of the distance G4, for example, in the range of 100% to 200%. When the distance G3 is smaller than the distance G4, the difference in luminous intensity between the region passing through the hole R0 and its periphery may increase. Here, adjacent holes R0 may be connected to each other.

Figure 26:
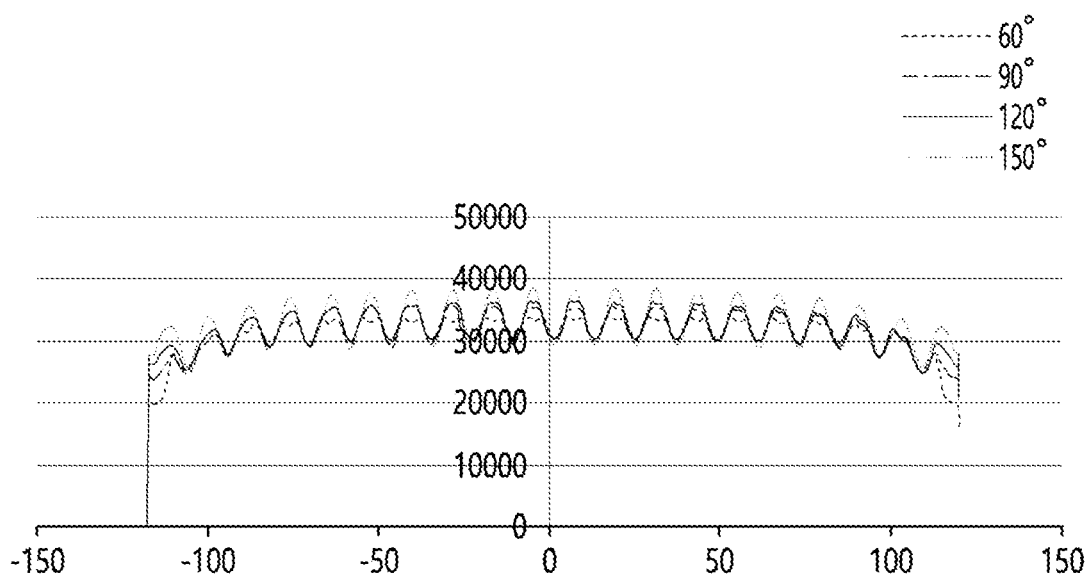
FIG. 26 is a view comparing the luminous intensity according to the emission angle of the hole of the lighting module of FIG. 20.

As shown in FIG. 3, the height of the hole R0 is the same as the thickness Zb of the resin layer 220, or is in the range of 50% to 100% or 80% to 100% of the thickness Zb of the resin layer 220. A lower surface of the first reflective member 240 may be disposed on the upper surface of the hole R0. On the lower surface of the hole R0, an upper surface of the second reflective member 230 may be disposed, an upper surface of the substrate 210 may be disposed, or a portion of the resin layer 220 may be disposed. The hole R0 may be formed by disposing a fixing pin in the resin layer 220 and removing the fixing pin after the resin layer 220 is cured. Here, when the fixing pin is first disposed in the process of forming the hole R0 and then the resin layer 220 is dispensed and cured, the resin may not be disposed on the bottom of the fixing pin. As another example, when the resin layer 220 is dispensed and the fixing pin is inserted before curing, a portion of the resin may be present at the bottom of the fixing pin. Accordingly, the height of the hole R0 may be equal to the thickness Zb of the resin layer 220 or in the range of 50% to 100% or 80% to 100% of the thickness Zb of the resin layer 200. The top view shape of the hole R0 may include a polygonal shape or a shape having a curved surface. The polygonal shape may be a triangular, quadrangular, or pentagonal shape or more. The hole R0 may include a first surface portion Ra facing the light emitting device 100, and a second surface portion Rb and a third surface portion Rc facing the first surface S1. The first surface portion Ra may be a region to which the light is incident. The second surface portion Rb and the third surface portion Rc may be surfaces for emitting light traveling through the first surface portion Ra or another surface portion. The first surface portion Ra may have a height of the hole R0 and a maximum length in the first direction X of the hole R0. The second surface portion Rb and the third surface portion Rc may be disposed to be inclined from both ends of the first surface portion Ra. The distance between the second surface portion Rb and the third surface portion Rc may be the largest in the first surface portion Ra, and the smallest point at a point closest to the first surface S1. The second surface portion Rb and the third surface portion Rc may provide vertices at intersections with each other. The interior angle C1 of the vertex Rp may be 120 degrees or less, for example, in the range of 60 degrees to 120 degrees. That is, the interior angle C1 of the vertex Rp is the angle between the second surface portion Rb and the third surface portion Rc or the interior angle of the emission region, and may be in the range of 60 degrees or more or 60 degrees to 120 degrees. Here, (A) of FIG. 20 is a case in which the interior angle C1 of the emission region of the hole R0 is 60 degrees, (B) is 90 degrees, (C) is 120 degrees, and (D) may be provided at 150 degrees. Here, when the interior angle C1 of the emission region of the hole R0 is changed, the position and length of the first surface portion Ra are fixed and measured. The luminance graph according to the interior angle of the hole R0 may be provided as shown in FIG. 26. As shown in Table 1, when the interior angle C1 is 60 degrees to 120 degrees, the light uniformity may be 84% or more, and when the interior angle C1 is 150 degrees, it may be about 80%.

TABLE 1

| Interior angle (degree) | 60 | 90 | 120 | 150 |
|---|---|---|---|---|
| Uniformity (%) | 85.4% | 85.1% | 84.8% | 79.7% |
| Luminance (nit) | 6477 | 6720 | 6881 | 7015 |

Figure 8:
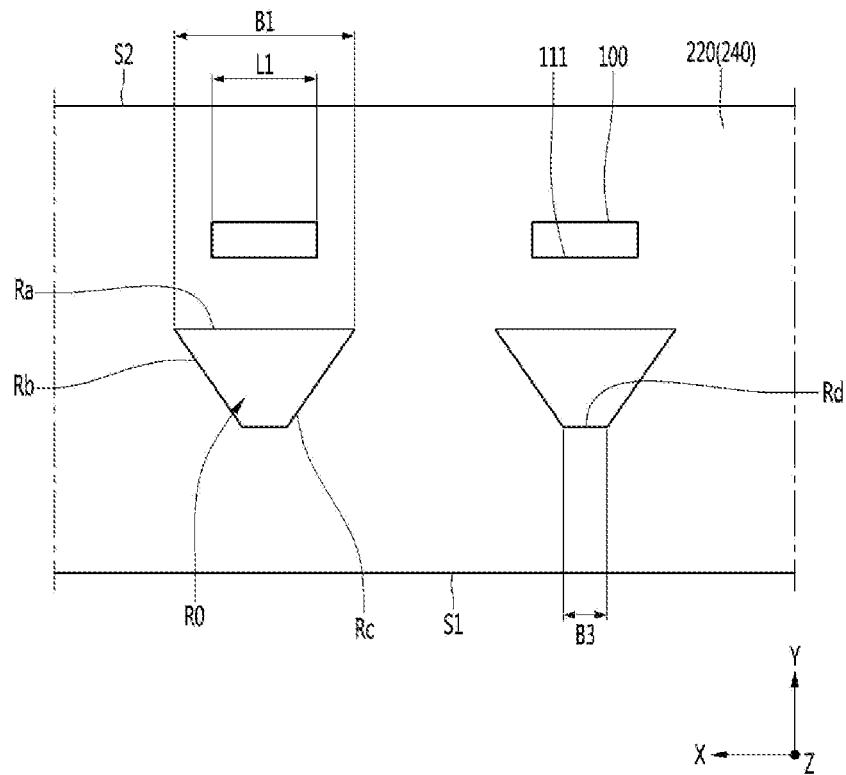
FIGS. 8 to 12 are modified examples of the hole of the lighting module of FIG. 2.
Figure 9:
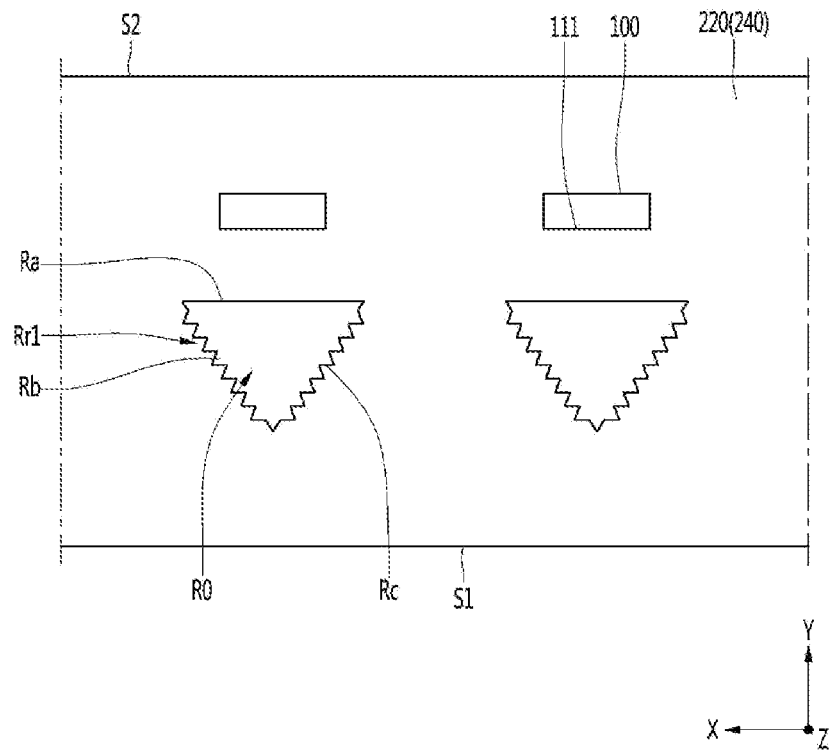
Figure 10:
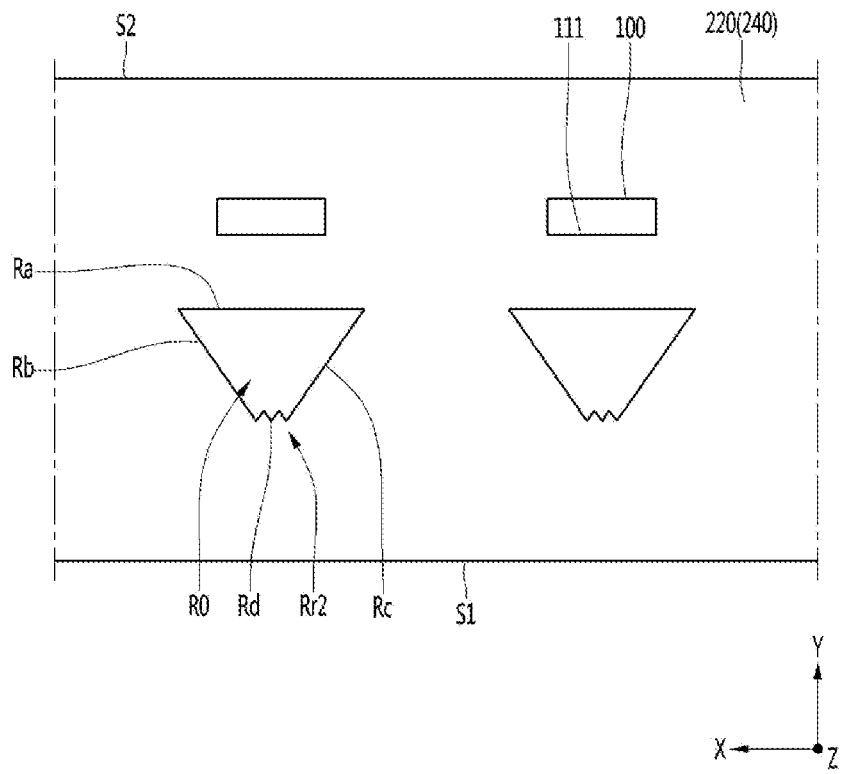
Figure 11:
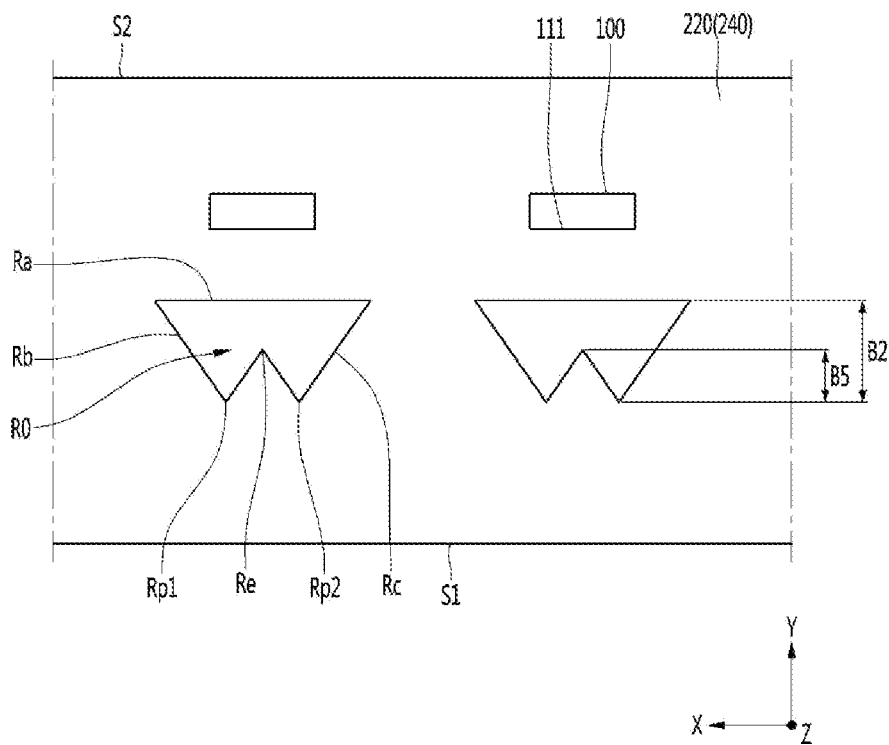
Figure 12:
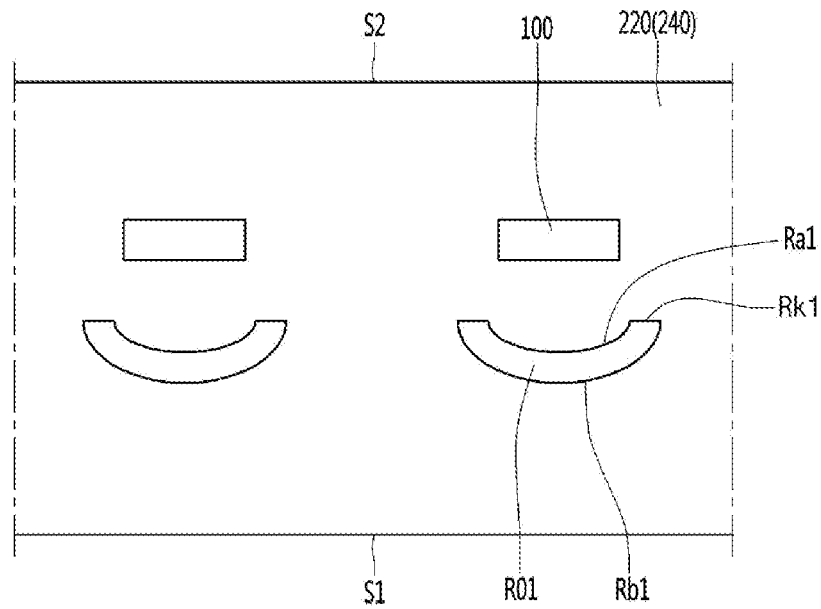

Accordingly, by selecting the interior angle C1 of the emission region of the hole R0 in the range of 60 degrees to 120 degrees, the uniformity of light emitted through the second and third surface portions Rb and Rc of the hole R0 may be improved. In the first embodiment, the resin layer 220 is adjacent to the first surface S1 and has a plurality of holes R0 arranged along the first surface S1, and each of the plurality of holes R0 may be disposed between each of the light emitting devices 100 and the first surface S1, respectively. Accordingly, since the light emitted through the light emitting device 100 is diffused by the hole R0, the uniformity of the light emitted through the first surface S1 may be improved. Also, hot spots may be eliminated. In addition, in order to improve light uniformity on the first surface S1, a convex lens may not be formed. In addition, since the distance between the first surface S1 and the light emitting device 100 may be reduced, it is possible to suppress an increase in the width of the module. FIGS. 8 to 12 are examples in which the hole of the lighting module according to the first embodiment is modified. For convenience of description, the configuration of the first embodiment will be selectively included, and the modified holes will be described. Referring to FIG. 8, the hole R0 may include a first surface portion Ra, a second surface portion Rb, and a third surface portion Rc, and a fourth surface portion Rd facing the first surface portion Ra. The fourth surface portion Rd may be connected between the second surface portion Rb and the third surface portion Rc, and may have a length B3 smaller than the length B1 of the first surface portion Ra. The fourth surface portion Rd may have a shape in which the vertex of FIG. 7 is removed. The fourth surface portion Rd may transmit light incident through the first surface portion Ra to a minimum. A convex pattern may be formed on the first surface S1 facing the fourth surface portion Rd, but the invention is not limited thereto. Referring to FIG. 9, the hole R0 includes a first surface portion Ra, a second surface portion Rb, and a third surface portion Rc, and the second surface portion Rb and the third surface portion Rc may include a concave-convex pattern Rr1. The concave-convex pattern Rr1 may be provided in a triangular prism shape, and may diffuse incident light. Lights incident by the concavo-convex pattern Rr1 may be diffused through various paths, and light uniformity may be further improved. Referring to FIG. 10, the fourth surface portion Rd of the hole R0 may include a plurality of concavo-convex patterns Rr2. Since the fourth surface portion Rd has a plurality of concavo-convex patterns Rr2, a hot spot caused by light emitted through the fourth surface portion Rd of the hole R0 may be suppressed. Referring to FIG. 11, the hole R0 includes a first surface portion Ra, second and third surface portions Rb and Rc, and may include a recess portion Re concave in the direction of the light emitting device in a region between the second surface portion Rb and the third surface portion Rc, and the recess portion Re may face the light emitting device 100. A first vertex portion Rp1 may be connected between the recess portion Re and the second surface portion Rb, and a second vertex portion Rp2 may be connected between the recess portion Re and the third surface portion Rc. The depth B5 of the recess portion Re may be 10% or more of the width B2 of the hole R0, for example, in a range of 10% to 50%. A lower point of the recess portion Re may be disposed closer to the first surface portion Ra than the first and second vertex portions Rp1 and Rp2. The center of the recess Re may be disposed in the same region as the center of the light emitting device 100. The recess portion Re adjusts the degree of diffusion of the incident light according to the depth B5, thereby suppressing a hot spot in the center of the light emitting device 100. Referring to FIG. 12, the hole R01 may include a first surface portion Ra1 convex in the direction of the first surface S1 of the resin layer 220, and a curved second surface portion Rb1 facing the first surface portion Ra1. The interval between the first surface portion Ra1 and the second surface portion Rb1 may be constant or may be wider toward the center of the hole R01. The outer surface Rk1 between the first surface portion Ra1 and the second surface portion Rb1 may be a horizontal surface or an inclined surface. The first surface portion Ra1 may refract incident light, and the second surface portion Rb2 may refract the refracted light again. The hole R01 may diffuse the light incident by the first surface portion Ra1 and the second surface portion Rb1.

Figure 13:
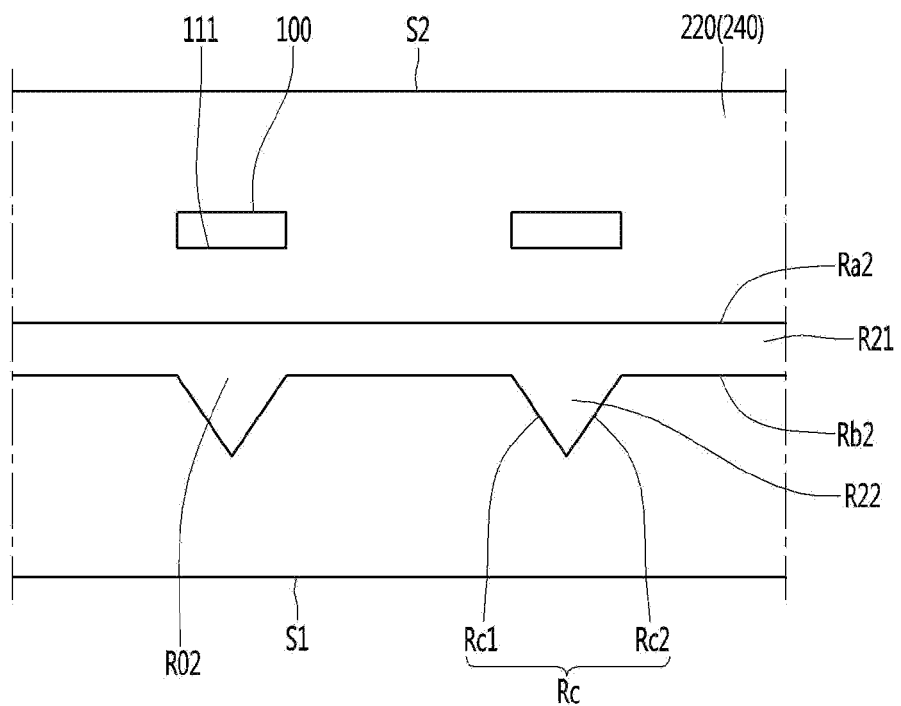
FIG. 13 is another example of the hall of the lighting module of FIG. 2.

FIG. 13 is a modified example of the hole. The hole R02 may include a first hole portion R21 having a long length in one direction and a second hole portion R22 protruding from the first hole portion R21 in the direction of the first surface S1 of the resin layer 220. The first hole portion R21 may include a first surface portion Ra2 facing the plurality of light emitting devices 100, and the second surface portion Rb2 opposite to the first surface portion Ra2 may be an exit surface. The second hole portion R22 includes an exit surface portion Rc having third and fourth inclined surface portions Rc1 and Rc2, and the third and fourth surface portions Rc1 and Rc2 may be horizontally overlapped with each of the light emitting devices 100. The third and fourth surface portions Rc1 and Rc2 form vertices in a region adjacent to the first surface S1, and the interior angle of the vertices may be 120 degrees or less, for example, 60 to 120 degrees. The second hole portion RR2 may guide incident light and spread it laterally.

FIGS. 14 to 19 are examples of plan views showing a hole of a lighting module according to a second embodiment. The configuration of the lighting module can be selectively applied to the configuration of the first embodiment, and the changed part will be described.

Figure 14:
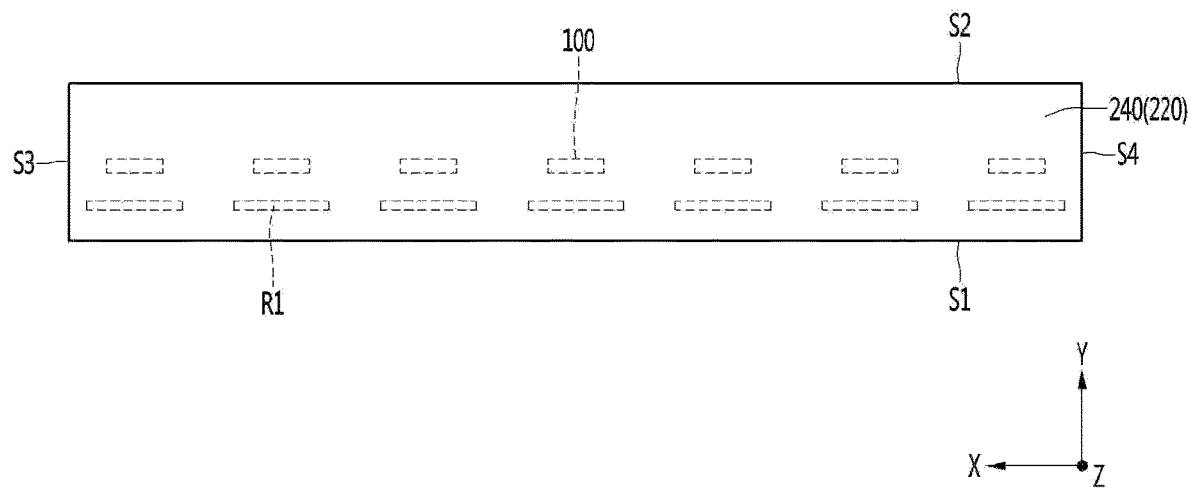
FIG. 14 is an example of a plan view of a lighting module according to a second embodiment of the invention.
Figure 15:
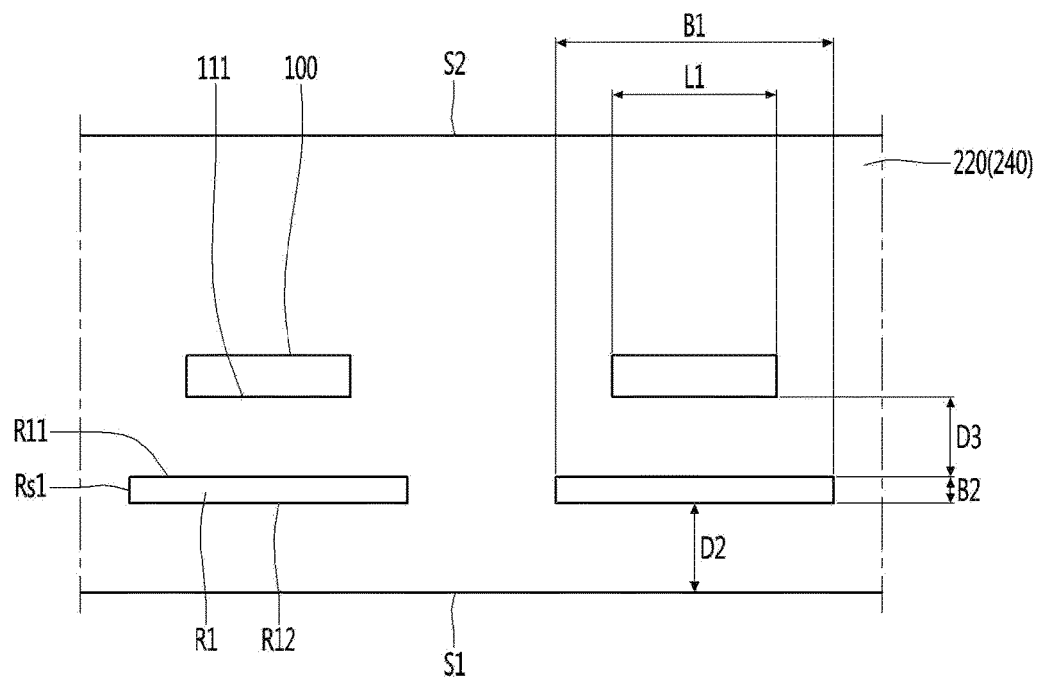
FIG. 15 is a partially enlarged view for explaining a hole of the lighting module of FIG. 14.

Referring to FIGS. 14 and 15, the resin layer 220 includes a plurality of holes R1 therein, and the plurality of holes R1 may each correspond to the light emitting device 100. The plurality of holes R1 may be respectively disposed between the light emitting device 100 and the first surface S1 of the resin layer 220. The hole R1 may have a bar shape or a rectangular shape having an elongated shape in one direction. A first direction length B1 of the hole R1 may be longer than a first direction length L1 of the light emitting device 100. The plurality of holes R1 may be spaced apart from each other.

The first direction length B1 of the hole R1 may be longer than the first direction length L1 of the light emitting device 100 by 1 mm or more. The width B2 in the second direction of the hole R1 may be 1 mm or more, for example, 1 mm to 3 mm. A distance D3 between the hole R1 and the light emitting device 100 may be closer than a distance D2 between the hole R1 and the first surface S1. The hole R1 may include a first surface portion R11 facing the light emitting device 100 and a second surface portion R12 facing the first surface S1. An outer surface Rs1 is disposed at both ends between the first and second surface portions R11 and R12, and the outer surface Rs1 may extend perpendicular to at least one or both of the first surface portion R11 and the second surface portion R12. Accordingly, the light incident on the hole R1 may be diffused, and the diffused light may be output as line surface light.

Figure 16:
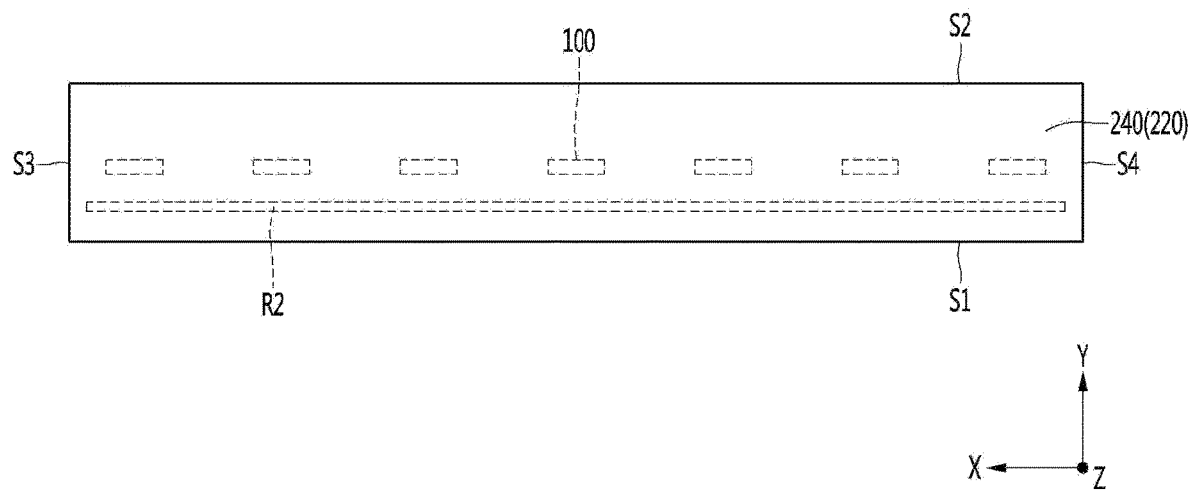
FIGS. 16 to 19 are modified examples of the hole of the lighting module of FIG. 14.

As shown in FIG. 16, a single hole R2 may be disposed to have a length to cover the plurality of light emitting devices 100. The hole R2 may have a bar shape or a rectangular shape. The length of the hole R2 in the first direction may be 80% or more of the maximum length of the resin layer 220 in the first direction. A length of the hole R2 in the first direction may be greater than a length connecting the outermost ends of the plurality of light emitting devices 100. Accordingly, the hole R2 may be disposed between each of the light emitting devices 100 and the first surface S1 and may be disposed to correspond to the region between the light emitting devices 100. Accordingly, since the hole R2 covers the emission side of the light emitting device 100 and the outer region thereof, it is possible to diffuse the incident light and prevent a hot spot on the first surface S1. The hole R2 may be provided in a sine wave shape or may include convex portions each convex in the direction of the light emitting device 100 and/or concave portions convex in the direction of the first surface S1. The bar-shaped hole R2 may reduce the straightness of the incident light.

Figure 17:
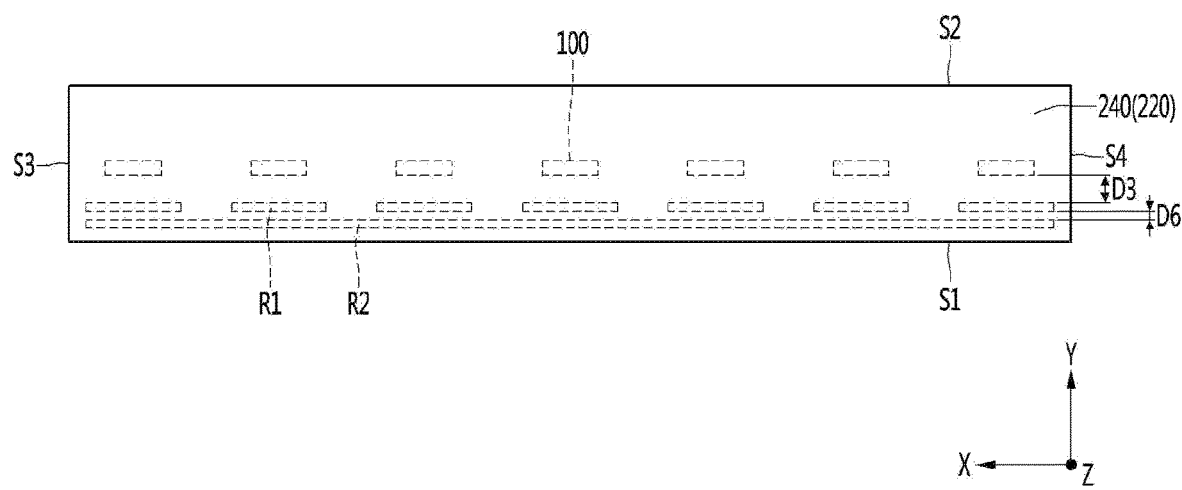

As shown in FIG. 17, the resin layer 220 may include a first hole R1 adjacent to the light emitting device 100 and a second hole R2 adjacent to the first surface S1 of the resin layer 220. At least one of the first hole R1 and the second hole R2 may be single or plural. The plurality of holes R1 and R2 may be arranged in at least two rows between the light emitting device 100 and the first surface S1 of the resin layer 220. A plurality of the first holes R1 may be arranged in the first direction and may face each of the plurality of light emitting devices 100. The first holes R1 may be disposed between the light emitting device 100 and the second holes R2, respectively. A single second hole R2 may be disposed in the first direction and may be disposed between the first hole R1 and the first surface S1 of the resin layer 220, respectively. The length of the longer hole among the first and second holes R1 and R2 may be twice or more than five times the length of the shorter hole. A long hole R2 among the first and second holes R1 and R2 may be spaced apart from the third and fourth side surfaces S3 and S4. The distance D6 between the first and second holes R1 and R2 may be at least 1 mm apart, and may be equal to or smaller than the distance D3 between the first hole R1 and the light emitting device 100. At least a portion of the first and second holes R1 and R2 may be connected to each other, which may vary depending on the shape of the fixing pin. The lengths of the first holes R1 in the first direction X may be the same or shorter than the lengths of the second holes R3. Conversely, the positions of the first hole R1 and the second hole R2 may be changed from each other. The first and second holes R1 and R2 are arranged in a double structure and overlap the light emitting device 100 in a horizontal direction, thereby reducing a hot spot in the center of the light emitting device.

Figure 18:
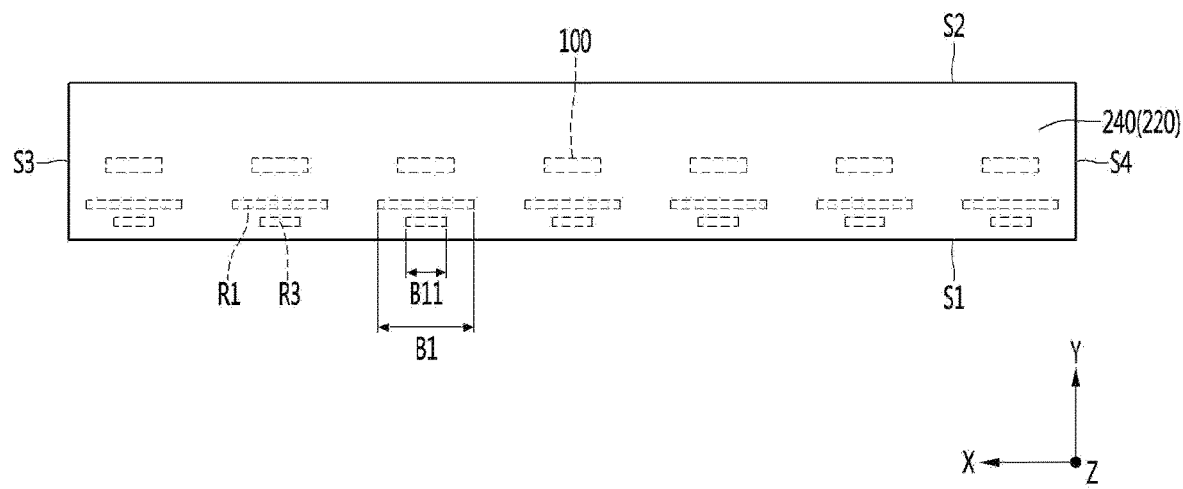

As shown in FIG. 18, the resin layer 220 may include a first hole R1 adjacent to the light emitting device 100 and a second hole R3 adjacent to the first surface S1 of the resin layer 220. The first hole R1 and the second hole R3 may be plural. The plurality of first holes R1 may be arranged in the first direction X and face each light emitting device 100. The first hole R1 may be disposed between the light emitting device 100 and the second hole R3, respectively. A plurality of the second holes R3 may be arranged in the first direction X and may be disposed between the first hole R1 and the first surface S1 of the resin layer 220. The lengths B11 and B1 of the first and second holes R1 and R3 in the first direction are equal to each other, or the length B11 of the second hole R3 may be shorter than the length B1 of the first hole R1. Alternatively, the positions of the first hole R1 and the second hole R3 may be changed from each other. The first and second holes R1 and R3 are disposed in a double structure and overlap the light emitting device 100 in a horizontal direction, thereby reducing a hot spot in the center of the light emitting device.

Figure 19:
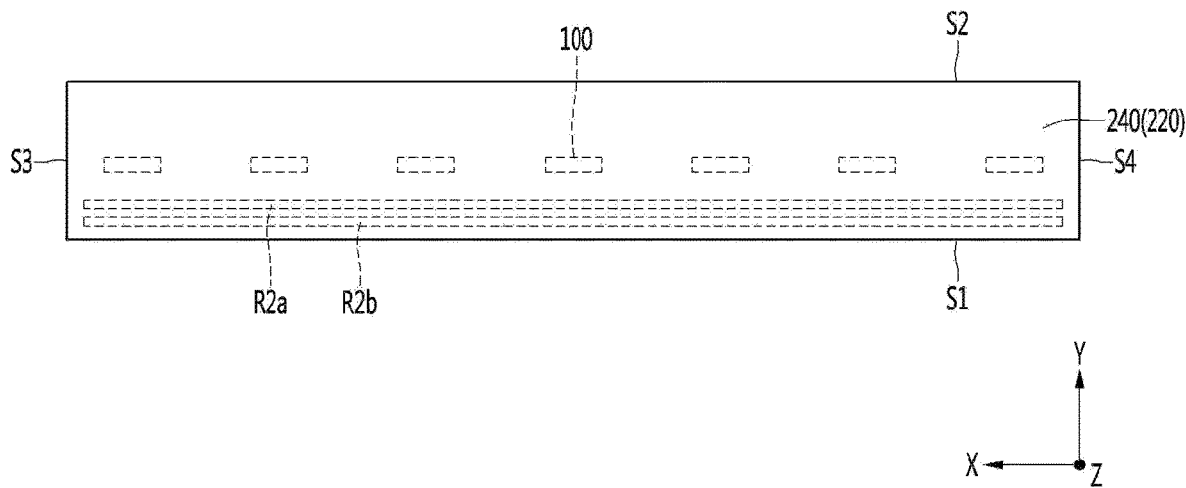
Figure 20A:
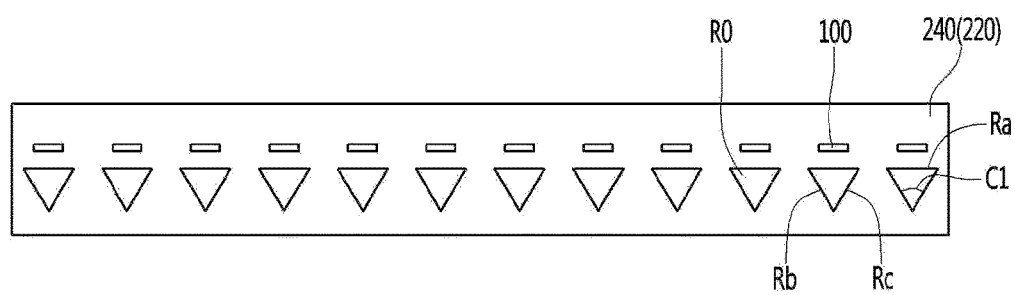
FIG. 20A to 20D are examples in which emission side angles of holes in the lighting module of FIG. 2 are modified.
Figure 20B:
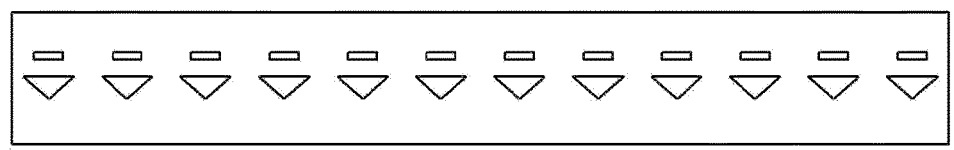
Figure 20C:
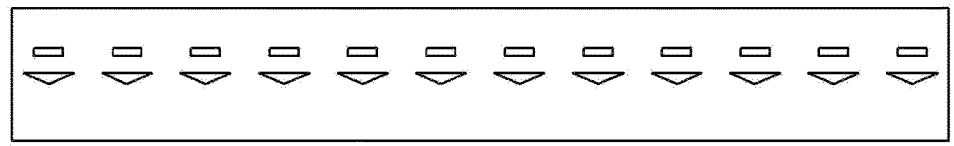
Figure 20D:
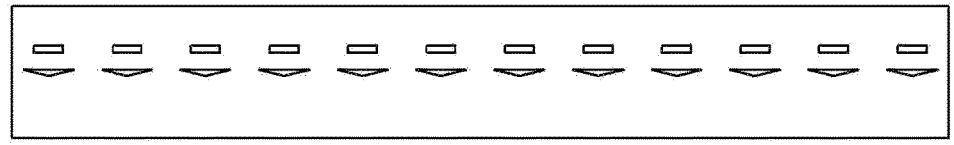

As shown in FIG. 19, the plurality of holes R2a and R2b have a long length in the first direction, the plurality of holes R2a and R2b may overlap in the second direction, and may include regions do not overlap in the first direction. The plurality of holes R2a and R2b may be disposed parallel to each other. A first hole R2a adjacent to the light emitting device 100 among the plurality of holes R2a and R2b may be parallel to a straight line connecting the light emitting devices 100. A second hole R2b adjacent to the first surface S1 among the plurality of holes R2a and R2b may be parallel to the first surface S1. Each of the plurality of holes R2a and R2b may be spaced apart from the third and fourth side surfaces S3 and S4. The plurality of holes R2a and R2b may be disposed closer to the third and fourth side surfaces S3 and S4 than the outermost light emitting device 100. Accordingly, light incident from the entire light emitting device 100 may be diffused.

As shown in FIG. 21, the lighting module 201 may be provided in a curved shape based on a horizontal straight line X0. When applied to a vehicle ramp, it may be combined into a curved ramp shape extending to the rear (or front) and sides of the vehicle. In the lighting module 201, the angle between the virtual straight line X2 connecting both ends of the first surface S1 in the straight line X0 may be an angle C2 in the range of 10 degrees to 60 degrees, and a virtual straight line X3 extending in a tangential direction from the first surface S1 disposed at one end of the lighting module 201 may have an angle C3 in the range of 5 degrees to 30 degrees. A virtual line connecting the adjacent light emitting devices 100 in the lighting module 201 may include a straight line, an oblique line, or a curved line. The virtual line connecting the plurality of holes R0 may include a straight line, an oblique line, or a curved line. Here, a portion of the line connecting the light emitting devices 100 may be disposed closer to the first surface direction than a virtual straight line connecting the other end from one end of the first surface S1 of the lighting module 201.

Figure 22:
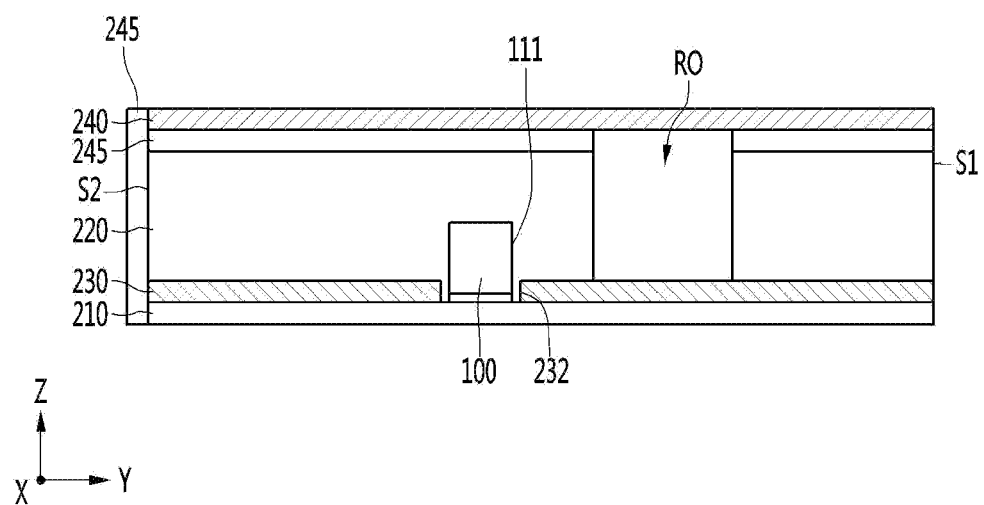
FIG. 22 is an example in which a reflective portion is disposed at the rear side of the lighting module according to an embodiment of the invention.

As shown in FIG. 22, in the lighting module, a third reflective member 245 may be disposed on the rear or second side S2 of the resin layer. The third reflective member 245 may be a metal or a non-metal material among the materials of the reflective member disclosed above. The third reflective member 245 extends from the side surface of the substrate 210 to the side surface of the first reflective member 240 or may be disposed on the side surface of the resin layer 220 at the side height of the resin layer 220. The third reflective member 245 may re-reflect the light reflected from the hole R0 or the first surface S1.

Figure 23A:
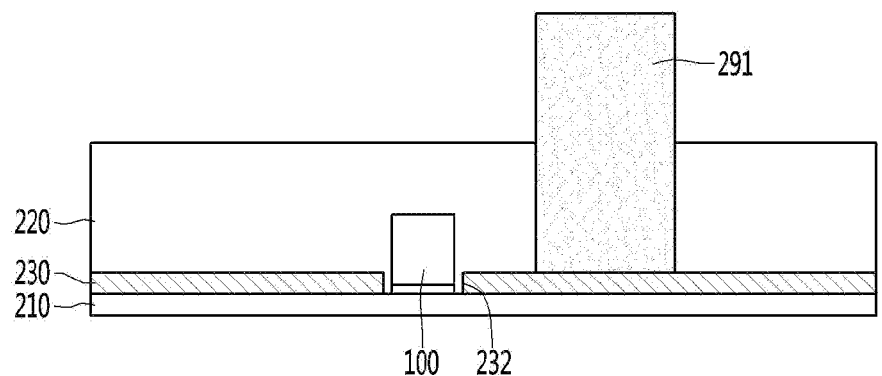
FIG. 23A to 23C are examples of a manufacturing process of a lighting module according to an embodiment of the invention.
Figure 23B:
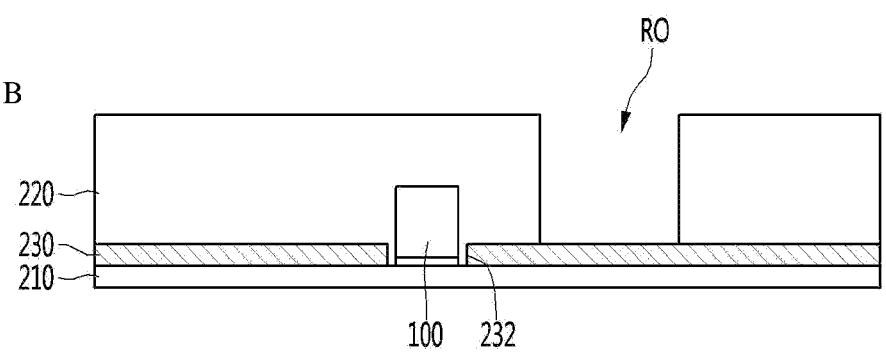
Figure 23C:
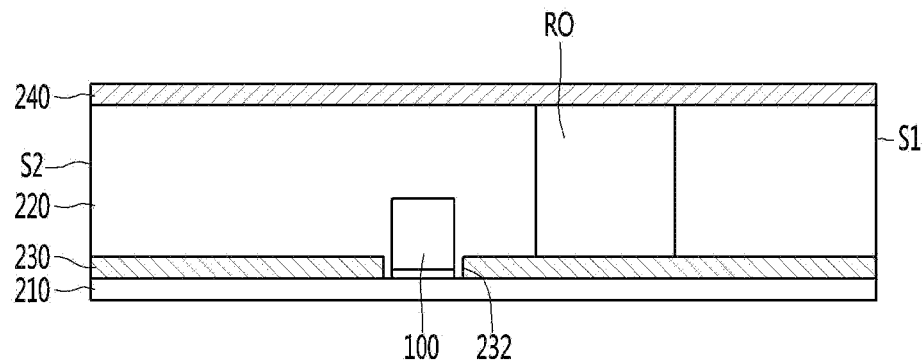

FIG. 23(A)-(C) are views illustrating a manufacturing process of a lighting module according to an embodiment. As shown in (A) of FIG. 23, the fixing pin 291 may penetrate through the resin layer 220 and contact the second reflective member 230 or the substrate 210. In this case, the fixing pin 291 may be disposed before the resin layer 220 is formed, and after the resin layer 220 is dispensed and cured, it may be separated as shown in (B). As another example, after dispensing the resin layer 220, the fixing pins 291 are positioned, and when the resin layer 220 is cured, the fixing pins may be separated as shown in (B). As shown in (C) of FIG. 23, when the hole R0 is formed in the region where the fixing pin is removed, the first reflective member 240 is formed on the resin layer 220. The first reflective member 240 may be disposed on the resin layer 220 and the hole R0. At least one position of the hole R0 may be disposed between the light emitting device 100 and the first surface S1.

Figure 24:
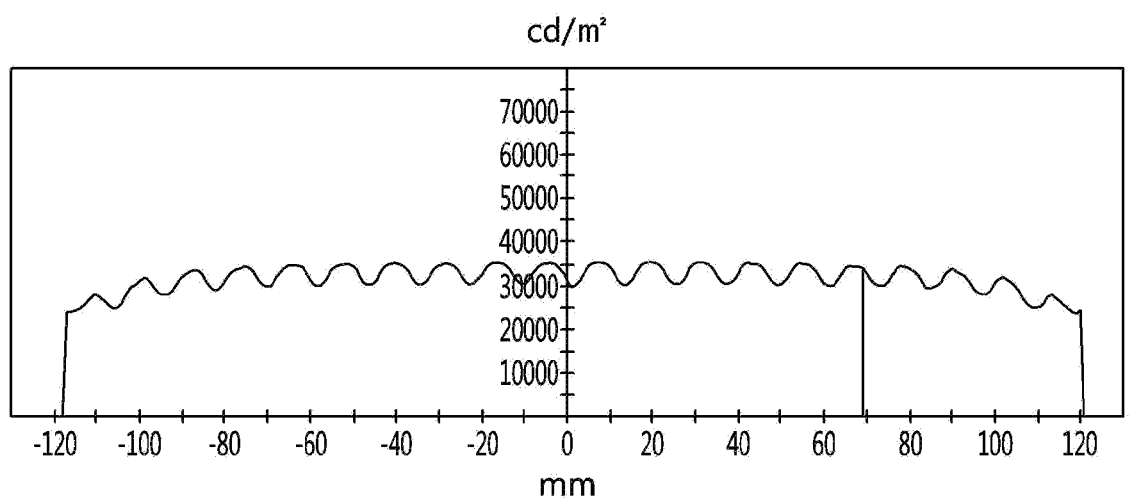
FIG. 24 is a view showing the luminous intensity of the lighting module according to the first embodiment of the invention.
Figure 25:
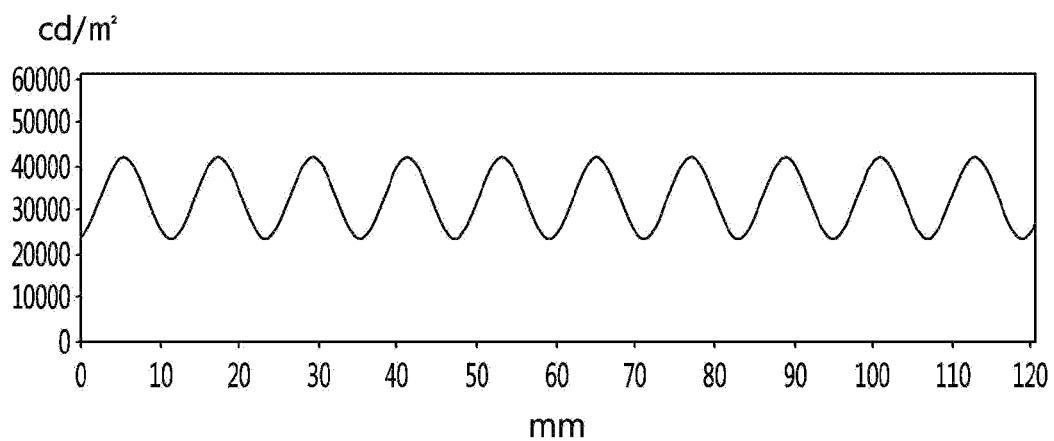
FIG. 25 is a view showing the luminous intensity of the lighting module according to the second embodiment of the invention.

FIG. 24 is a luminous intensity distribution of the lighting module according to the first embodiment of the invention, and FIG. 25 is a graph showing the luminous intensity distribution of the lighting module according to the second embodiment. As shown in FIG. 24, the light intensity distribution by the triangular hole may provide a light uniformity of 80% or more, for example, 85% or more. As shown in FIG. 25, it can be seen that the light intensity distribution by the line-shaped or bar-shaped hole has a light uniformity of 50% or more. FIG. 26 is a view showing the luminous intensity distribution at 60 degrees, 90 degrees, 120 degrees and 150 degrees of the interior angle C1 along (A)-(D) of each lighting module of FIG. 20. It may be seen that the range of the interior angle of 60 degrees to 120 degrees has a uniform distribution of about 85%, and in the case of 150 degrees, it may be seen that it has a uniform distribution of about 80%.

Figure 27:
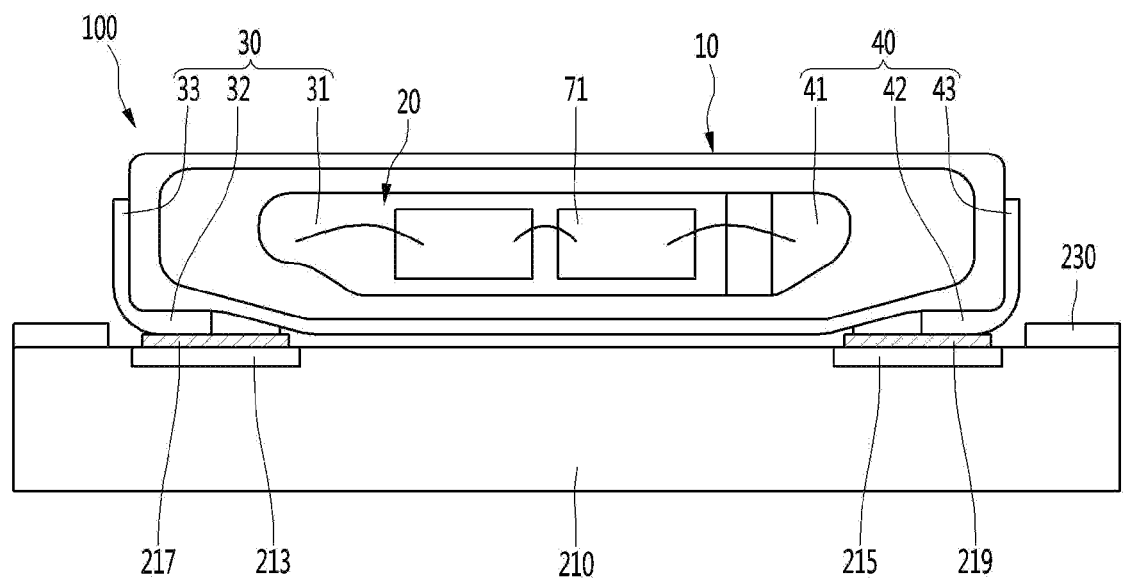
FIG. 27 is an example of a front view of a light emitting device applied to a lighting module according to an embodiment of the invention.
Figure 28:
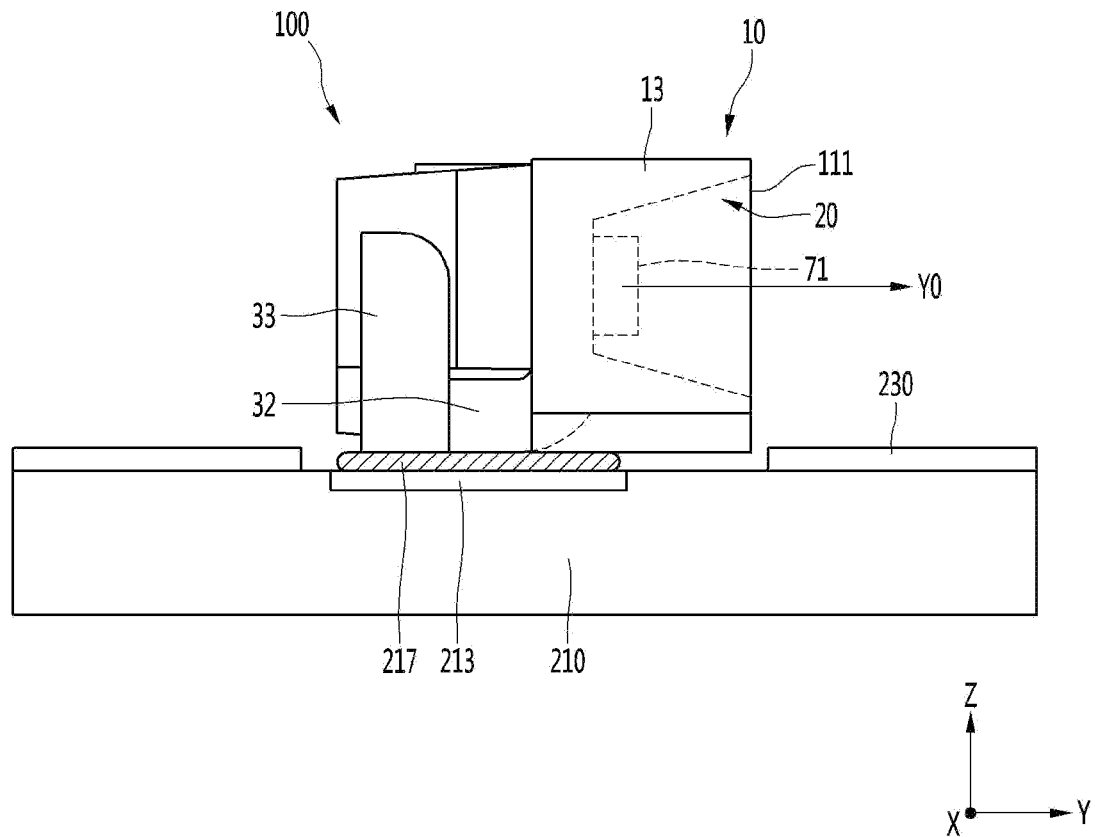
FIG. 28 is an example of a module in which the light emitting device of FIG. 27 is disposed on a circuit board.

FIG. 27 is an example of a module in which a light emitting device is disposed on a circuit board in a lighting module according to an embodiment of the invention, and FIG. 28 is a view of the module viewed from the other side of FIGS. 27 and 28, the light emitting device 100 includes a body 10 having a cavity 20, a plurality of lead frames 30 and 40 in the cavity 20, and one or a plurality of light emitting chips 71 disposed on at least one of the plurality of lead frames 30 and 40. The light emitting device 100 is an example of the light emitting device disclosed in the above embodiment, and may be implemented as a side emission type package. The light emitting device 100 may have a length (or a length of a long side) in the first direction X that is three times or more, for example, four times or more, than a width in the second direction Y. The length of the second direction Y may be 2.5 mm or more, for example, in the range of 2.7 mm to 6 mm, or in the range of 2.5 mm to 3.2 mm. The light emitting device 100 may reduce the number of the light emitting devices 100 in the first direction X by providing a longer length in the first direction X. The light emitting device 100 may provide a relatively thin thickness, thereby reducing the thickness of the lighting device having the light emitting device 100. The thickness of the light emitting device 100 may be in the range of 2 mm or less, for example, 1.5 mm or less, or 0.6 mm to 1 mm. The body 10 has the cavity 20 and the length in the first direction X may be three times or more compared to the thickness of the body 10, so as to widen the beam angle of the light in the first direction X. At least one or a plurality of lead frames 30 and 40 are disposed on the body 10. At least one or a plurality of lead frames 30 and 40 are disposed on the bottom of the cavity 20. A first lead frame 30 and a second lead frame 40 are coupled to the body 10, for example. The body 10 may be formed of an insulating material. The body 10 may be formed of a reflective material. The body 10 may be formed of a material having a reflectance higher than a transmittance for a wavelength emitted from the light emitting chip, for example, a material having a reflectance of 70% or more. When the reflectance is 70% or more, the body 10 may be defined as a non-transmissive material or a reflective material. The body 10 may be formed of a resin-based insulating material, for example, a resin material such as Polyphthalamide (PPA). The body 10 may be formed of a silicone-based, epoxy-based, or thermosetting resin including a plastic material, or a material having high heat resistance and high light resistance. The body 10 may include a reflective material, for example, a resin material to which a metal oxide is added, and the metal oxide may include at least one of TiO2, SiO2, and Al2O3. The body 10 may effectively reflect incident light. As another example, the body 10 may be formed of a translucent resin material or a resin material having a phosphor for converting the wavelength of incident light. The first side portion 15 of the body 10 may be a surface on which the cavity 20 is disposed, or a surface on which light is emitted. The second side portion of the body 10 may be the opposite side of the first side portion 15 or the second side.

The first lead frame 30 may include a first lead portion 31 disposed on the bottom of the cavity 20, and a first bonding portion 32 disposed in a first outer region of the third side portion 11 of the body 10, and a first heat dissipation portion 33 disposed on the third side surface portion 13 of the body 10. The first bonding portion 32 is bent from the first lead portion 31 in the body 10 and protrudes to the third side portion 11, and the first heat dissipation portion 33 may be bent from the first bonding portion 32. The first outer region of the third side surface portion 11 may be an area adjacent to the third side surface portion 13 of the body 10. The second lead frame 40 may include a second lead portion 41 disposed on the bottom of the cavity 20 and a second bonding portion 42 disposed in a second outer region of the third side portion 11 of the body 10, and a second heat dissipation portion 43 disposed on the fourth side surface portion 14 of the body 10. The second bonding portion 42 may be bent from the second lead portion 41 in the body 10, and the second heat dissipation portion 43 may be bent from the second bonding portion 42. The second outer region of the third side surface portion 11 may be a region adjacent to the fourth side surface portion 14 of the body 10. The interval portion 17 between the first and second lead portions 31 and 41 may be formed of a material of the body 10, and may be on the same horizontal plane as the bottom of the cavity 20 or may protrude, but not limited thereto. As another example, two or more lead frames may be disposed in the body 10, for example, three lead frames are disposed, one of which may be a heat dissipation frame or a frame of positive polarity, and the other two may have different negative polarities.

Here, the light emitting chip 71 may be disposed on the first lead portion 31 of the first lead frame 30, for example, and may be connected to the first lead part 31 by the wires 72 and 73, or may be connected to the first lead portion 31 with an adhesive and connected to the second lead portion 41 with a wire. The light emitting chip 71 may be a horizontal chip, a vertical chip, or a chip having a via structure. The light emitting chip 71 may be mounted in a flip chip method. The light emitting chip 71 may selectively emit light within a wavelength range of ultraviolet to visible light. The light emitting chip 71 may emit, for example, ultraviolet or blue peak wavelength. The light emitting chip 71 may include at least one of a group II-VI compound and a group III-V compound. The light emitting chip 71 may be formed of, for example, a compound selected from the group consisting of GaN, AlGaN, InGaN, AlInGaN, GaP, AlN, GaAs, AlGaAs, InP, and mixtures thereof. A plurality of light emitting chips 71 may be connected in series or a plurality of light emitting chips 71 may be connected in parallel. One or a plurality of light emitting chips 71 disposed in the cavity 20 of the light emitting device 100 according to the embodiment may be disposed. The light emitting chip 71 may be selected from, for example, a red LED chip, a blue LED chip, a green LED chip, and a yellow green LED chip.

Looking at the inner surface of the cavity 20, the inner surface disposed around the cavity 20 may be inclined with respect to a horizontal straight line of the upper surfaces of the lead frames 30 and 40. The inner surface of the cavity 20 may have a vertically stepped region from the first side portion 15 of the body 10. The stepped region may be disposed to be stepped between the first side portion 15 and the inner surface of the body 10. The stepped region may control a directivity characteristic of light emitted through the cavity 20. A molding member 81 is disposed in the cavity 20 of the body 10, and the molding member 81 includes a light-transmitting resin such as silicone or epoxy, and may be formed in a single layer or in multiple layers. The molding member 81 or the light emitting chip 71 may include a phosphor for changing the wavelength of the emitted light. emitted as light. The phosphor may be selectively formed from quantum dots, YAG, TAG, silicate, nitride, and oxy-nitride-based materials. The phosphor may include at least one of a red phosphor, a yellow phosphor, and a green phosphor, but is not limited thereto. The surface of the molding member 81 may be formed in a flat shape, a concave shape, a convex shape, or the like, but is not limited thereto. As another example, a light-transmitting film having a phosphor may be disposed on the cavity 20, but the present disclosure is not limited thereto. A lens may be further formed on the upper portion of the body 10, and the lens may include a structure of a concave and/or convex lens, and the light distribution of light emitted from the light emitting device 100 may be adjusted.

A semiconductor device such as a light receiving device or a protection device may be mounted on the body 10 or any one of the lead frames, and the protection device may be implemented as a thyristor, a Zener diode, or a TVS (Transient voltage suppression), and the Zener diode protects the light emitting chip from electrostatic discharge (ESD).

Referring to FIG. 28, at least one or a plurality of light emitting devices 100 are disposed on the support member 210, and a protective layer and/or a reflective member 260 is disposed around the lower portion of the light emitting device 100. The light emitting device 100 is an example of the light emitting device disclosed in the embodiment, and emits light in the central axis Y0 direction, and may be applied to the lighting device disclosed above. The first and second lead portions 33 and 43 of the light emitting device 100 are bonded to the electrode patterns 213 and 215 of the substrate 210 with solder or conductive tape as conductive adhesive members 217 and 219.

Figure 29:
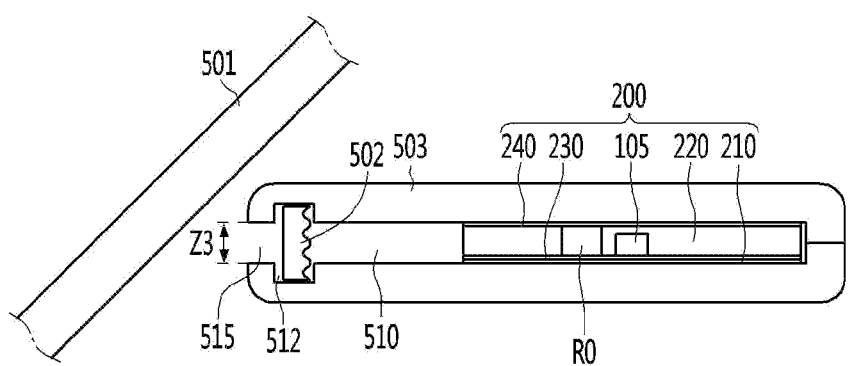
FIG. 29 is an example of a lamp to which a lighting module according to an embodiment of the invention is applied.

The lighting module according to an embodiment of the invention may be applied to a lamp as shown in FIG. 29. The lamp is an example of a vehicle lamp, such as a head lamp, a side lamp, a side mirror lamp, a fog lamp, a tail lamp, a brake lamp, a daytime running lamp, a vehicle interior lighting, a door scar, a rear combination lamp, or Applicable to backup lamps. Referring to FIG. 29, the lighting module 200 disclosed above may be coupled to a lamp in a housing 503 having an inner lens 502. The thickness of the lighting module 200 is such that it can be inserted into the inner width of the housing 503. The width Z3 of the emitting portion 515 of the inner lens 502 may be equal to or less than twice the thickness of the lighting module 200, thereby preventing a decrease in luminous intensity. The inner lens 502 may be spaced apart from the first surface of the lighting module 200 by a predetermined distance, for example, 10 mm or more. An outer lens 501 may be disposed on the emission side of the inner lens 502. A lamp having such a lighting module 200 is an example, and may be applied to other lamps as a structure having a ductility, for example, a curved surface or a curved structure when viewed from the side.

Figure 30:
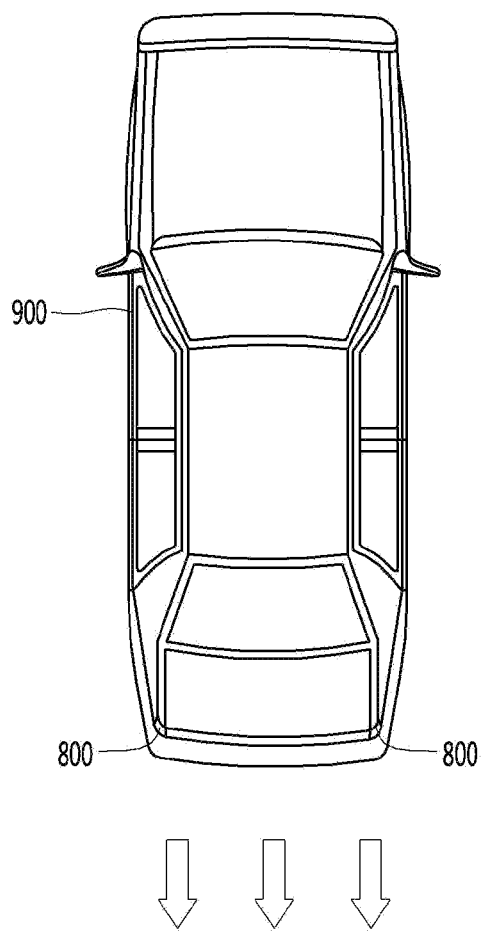
FIG. 30 is a plan view of a vehicle to which a lamp having a lighting device or a lighting module according to an embodiment of the invention is applied.
Figure 31:
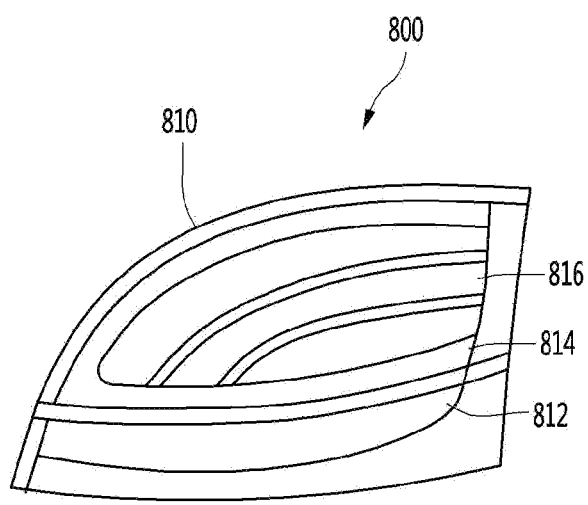
FIG. 31 is a view illustrating a lamp having the lighting module or lighting device of FIG. 30.

FIG. 30 is a plan view of a vehicle to which a vehicle lamp to which a lighting module is applied according to an embodiment is applied, and FIG. 31 is a view showing a vehicle lamp having a lighting module or a lighting device disclosed in the embodiment. Referring to FIGS. 30 and 31, the tail light 800 in the vehicle 900 may include a first lamp unit 812, a second lamp unit 814, a third lamp unit 816, and a housing 810. Here, the first lamp unit 812 may be a light source for the role of a turn indicator, the second lamp unit 814 may be a light source for the role of a sidelight, and the third lamp unit 816 may be a light source for the role of a brake light, but is not limited thereto. At least one or all of the first to third lamp units 812, 814, and 816 may include the lighting device or module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

The invention claimed is:
1. A lighting device comprising:
   a substrate;
   a plurality of light emitting devices arranged adjacently in a first direction on a substrate; and
   a resin layer disposed on the substrate and the plurality of light emitting devices,
   wherein the resin layer includes a first side surface and a second side surface disposed on both sides of a second direction perpendicular to the first direction, wherein a straight distance between a first light emitting device among the plurality of light emitting devices and the second surface of the resin layer is smaller than a straight distance between the first light emitting device and the first surface of the resin layer, wherein the resin layer includes a third side surface adjacent to the substrate and a fourth side surface opposite the third side surface, wherein the resin layer includes a hole penetrating from the fourth side surface toward the third side surface, and wherein a straight distance between the hole and the first light emitting device is smaller than a straight distance between the hole and the second side surface.

2. The lighting device of claim 1, comprising:
a first reflective member disposed on the fourth side surface of the resin layer,
wherein the first reflective member faces the fourth side surface of the resin layer and the hole.

3. The lighting device of claim 2, comprising a second reflective member disposed on the third side surface of the resin layer,
wherein the second reflective member is disposed between the third side surface of the resin layer and the substrate, and
wherein the second reflective member has a plurality of insertion holes into which lower portions of each of the plurality of light emitting devices are inserted.

4. The lighting device of claim 3, wherein a thickness of the first side surface of the resin layer is the same as an interval between the first and second reflective members.

5. The lighting device of claim 3, wherein a thickness of the second side surface of the resin layer is the same as an interval between the first and second reflective members.

6. The lighting device of claim 2, wherein a minimum distance between the hole and the first side surface of the resin layer is smaller than a minimum distance between the first side surface of the resin layer and the first light emitting device.

7. The lighting device of claim 2, wherein a minimum distance between the first side surface of the resin layer and the hole is equal to or greater than a minimum distance between the hole and the first light emitting device.

8. The lighting device of claim 2, wherein light generated from the plurality of light emitting devices is extracted as light with a highest luminous intensity through the first side surface of the resin layer.

9. The lighting device of claim 8, wherein a minimum distance between the first side surface of the resin layer and the first light emitting device is in a range of 4 mm to 20 mm.

10. The lighting device of claim 2, wherein the hole includes a first surface portion facing the first light emitting device, and second and third surface portions inclined from the first surface portion, and
wherein an interior angle between the second and third face portions is 120 degrees or less.

11. The lighting device of claim 1, wherein the hole is disposed closer to the first light emitting device than to the first surface of the resin layer.

12. The lighting device of claim 1, wherein a minimum distance between the hole and the first light emitting device is in a range of 2 mm to 4 mm.

13. The lighting device of claim 1, wherein a minimum distance between the hole and the first light emitting device is smaller than an interval between adjacent light emitting devices.

14. The lighting device of claim 1, wherein the hole includes a plurality of holes spaced apart in the first direction, and each of the plurality of holes faces an emission surface of each of the plurality of light emitting devices.

15. The lighting device of claim 14, wherein a maximum length of the hole in the first direction is greater than a length of the emission surface of the first light emitting device in the first direction.

16. A lighting device comprising:
a substrate;
a plurality of light emitting devices arranged adjacently in a first direction on a substrate; and
a resin layer disposed on the substrate and the plurality of light emitting devices,
wherein the substrate includes a first side surface and a second side surface opposite the first side surface in a second direction perpendicular to the first direction,
wherein a straight distance between a first light emitting device among the plurality of light emitting devices and a second side surface of the substrate is smaller than a straight distance between the first light emitting device and the first side surface of the substrate,
wherein the resin layer includes a lower surface adjacent to the substrate and an upper surface opposite to the lower surface,
wherein the resin layer includes a hole penetrating from the upper surface toward the lower surface,
wherein a straight distance between the hole and the first light emitting device is smaller than a straight distance between the hole and the second side surface.

17. The lighting device of claim 16, comprising: a first reflective member adhered to the upper surface of the resin layer, and a second reflective member disposed on the lower surface of the resin layer,
wherein the first reflective member is adhered to the upper surface of the resin layer and disposed on the hole,
wherein the second reflective member is adhered between the lower surface of the resin layer and the substrate,
wherein the second reflective member has a plurality of insertion holes into which lower portions of each of the plurality of light emitting devices are inserted.

18. The lighting device of claim 17, wherein a thickness of one side surface of the resin layer adjacent to the first side surface of the substrate is equal to an interval between the first and second reflective members, and
wherein a thickness of the other side surface of the resin layer adjacent to the second side surface of the substrate is a same as an interval between the first and second reflective members.

19. The lighting device of claim 17, wherein a minimum distance between the hole and the first side surface of the substrate is smaller than a minimum distance between the first side surface of the substrate and the first light emitting device, and
wherein the minimum distance between the first side surface of the substrate and the hole is equal to or greater than a minimum distance between the hole and the first light emitting device.

20. The lighting device of claim 17, wherein the hole is disposed closer to the first light emitting device than to the first side surface of the substrate, and
wherein a minimum distance between the hole and the first light emitting device is in a range of 2 mm to 4 mm.

* * * * *